(12) United States Patent
Mori et al.

(10) Patent No.: US 8,026,510 B2
(45) Date of Patent: Sep. 27, 2011

(54) ORGANIC ELECTRONIC DEVICE AND METHOD FOR PRODUCING THE SAME

(75) Inventors: Toshitaka Mori, Tokyo (JP); Junji Kido, Yonezawa (JP)

(73) Assignees: Dai Nippon Printing Co., Ltd., Tokyo-to (JP); KIDO, Junji, Yamagata (JP)

( * ) Notice: Subject to any disclaimer, the term of this patent is extended or adjusted under 35 U.S.C. 154(b) by 0 days.

(21) Appl. No.: 11/178,743

(22) Filed: Jul. 11, 2005

(65) Prior Publication Data

US 2006/0081840 A1 Apr. 20, 2006

(30) Foreign Application Priority Data

Oct. 20, 2004 (JP) ................................ 2004-306266

(51) Int. Cl.
*H01L 29/08* (2006.01)
(52) U.S. Cl. ........................................................ 257/40
(58) Field of Classification Search .................. 257/40; 428/690; 313/504
See application file for complete search history.

(56) References Cited

U.S. PATENT DOCUMENTS

| | | | | |
|---|---|---|---|---|
| 6,603,150 B2 * | 8/2003 | Liao et al. | ......................... | 257/98 |
| 6,869,693 B2 * | 3/2005 | Fryd et al. | ..................... | 428/690 |
| 2001/0031380 A1 * | 10/2001 | Yoon et al. | ..................... | 428/690 |
| 2002/0115877 A1 * | 8/2002 | Ueda et al. | ..................... | 556/418 |
| 2002/0136922 A1 * | 9/2002 | Sakai et al. | .................... | 428/690 |
| 2003/0026994 A1 * | 2/2003 | Hatakeyama et al. | ........ | 428/421 |
| 2003/0072967 A1 * | 4/2003 | Kido et al. | ..................... | 428/690 |
| 2003/0138662 A1 * | 7/2003 | Li et al. | .......................... | 428/690 |
| 2003/0165715 A1 | 9/2003 | Yoon et al. | | |
| 2003/0189401 A1 | 10/2003 | Kido et al. | | |
| 2003/0218166 A1 * | 11/2003 | Tsutsui | ........................... | 257/40 |
| 2004/0046496 A1 * | 3/2004 | Mishima | ....................... | 313/504 |

(Continued)

FOREIGN PATENT DOCUMENTS

EP 0949696 A2 10/1999

(Continued)

OTHER PUBLICATIONS

Yukou Matsuda et al; "An XPS study of sodium acetate electron injection layer in organic EL devices" Tokyo Institute of Technology.

(Continued)

*Primary Examiner* — N Drew Richards
*Assistant Examiner* — Jae Lee
(74) *Attorney, Agent, or Firm* — Ladas & Parry LLP

(57) ABSTRACT

A main object of the present invention is to provide an organic electronic device which has a high charge injection property by lowering a charge injection barrier between an electrode and an organic layer, and a layer having a charge injection function of which can be formed by a wet film forming method, and a method for producing the same. In order to attain the object, the present invention provides an organic electronic device comprising a substrate, two or more electrodes facing each other disposed on the substrate and at least one organic layer disposed between two electrodes among the electrodes, wherein a layer containing a reactive organic compound and/or a reaction product thereof is disposed between at least one electrode and an organic layer containing a charge injection transporting material, or at least one electrode and/or an organic layer containing a charge injection transporting material disposed adjacent to the electrode, contains a reactive organic compound and/or a reaction product thereof, and a method for producing the same.

15 Claims, 10 Drawing Sheets

U.S. PATENT DOCUMENTS

| | | | |
|---|---|---|---|
| 2004/0126616 A1* | 7/2004 | Iwasaki et al. | 428/690 |
| 2004/0150352 A1* | 8/2004 | Koide et al. | 315/169.3 |
| 2004/0251466 A1* | 12/2004 | Nakamura | 257/79 |
| 2005/0064239 A1* | 3/2005 | Takei | 428/690 |
| 2005/0064241 A1* | 3/2005 | Kambe et al. | 428/690 |
| 2005/0079277 A1* | 4/2005 | Takashima et al. | 427/58 |
| 2005/0225234 A1* | 10/2005 | Tyan et al. | 313/504 |

FOREIGN PATENT DOCUMENTS

| | | |
|---|---|---|
| EP | 1011155 A2 | 6/2000 |
| EP | 1011155 A2 * | 6/2000 |
| JP | 9-017574 A | 1/1997 |
| JP | 10-270171 | 10/1998 |
| JP | 11-233262 | 8/1999 |
| JP | 2000-091078 | 3/2000 |
| JP | 2000-243569 | 9/2000 |
| JP | 2001-267082 A | 9/2001 |
| JP | 2003-272860 A | 9/2003 |
| JP | 2003-303691 | 10/2003 |
| JP | 2004-006754 A | 1/2004 |
| JP | 2004-111228 A | 4/2004 |

OTHER PUBLICATIONS

Qianfei Xu et al; "Ultrahigh efficiency green polymer light-emitting diodes by nanoscale interface modification"; Applied Physics Letters, vol. 83, No. 23, Dec. 8, 2003.

Q. Pei et al; "Solid state polymer light-emitting electrochemical cells: Recent developments"; Synthetic Metal 85 (1997) 1229-1232.

C.W. Tang: "Two-layer organic photovoltaic cell", Applied Phys. Lett. 48, 183 (1986).

* cited by examiner

ORGANIC ELECTRONIC DEVICE AND METHOD FOR PRODUCING THE SAME

BACKGROUND OF THE INVENTION

1. Field of the Invention

The present invention relates to an organic electronic device and a method for producing the same. Particularly, an organic electronic device including an organic light emitting device such as an organic electroluminescent element, an organic transistor, an organic solar battery or the like, and a method for producing the same.

2. Description of the Related Art

Development of an organic electronic device is expected to a wide range of elementary elements including an organic light emitting device such as an organic electroluminescent elements (hereinafter referred to as an organic EL element), an organic transistor, an organic solar battery or the like and uses.

An organic EL element is a charge injection type self light emitting device, utilizing the light emission generated at the time of re-coupling an electron and a positive hole reaching at a light emitting layer. Such an organic EL element has been developed actively since 1987 when T. W. Tang, et al. proved that an element comprising laminated thin films of a fluorescent metal chelate complex and a diamine based molecule emits a light of a high luminance with a low driving voltage.

The element configuration of the organic EL element basically comprises cathode/organic layer/anode. The organic layer thereof in general has a two layer structure comprising a light emitting layer and a positive hole injection layer, or a three layer structure comprising an electron transporting layer, a light emitting layer and a positive hole transporting layer. In the organic EL element, it is necessary to supply charges (positive hole and electron) to a light emitting material to be the luminescent center efficiently and quickly. For that purpose, a charge transporting material is contained in the light emitting layer, a positive hole transporting layer is provided between the anode and the light emitting layer, or an electron transporting layer is provided between the cathode and the light emitting layer.

According to the organic EL element, in order to obtain a high luminous efficiency, it is necessary to efficiently inject charges (positive hole and electron) from the electrode to the organic layer, however, since the energy gap between the anode or the cathode and the organic layer such as the light emitting layer or the like is so large that the charges cannot be injected easily. Therefore, conventionally, the energy gap between the electrode and the organic layer is reduced by providing a positive hole or electron injection layer between the anode or the cathode and the organic layer, or by optimizing the work function of the anode or the cathode.

For example, for a cathode, an alloy of Mg or Li having small work function and relatively stable Ag or Al has been used as an electrode. However, in this case, since Mg or Li having small work function is easily oxidized and unstable, an element deteriorates due to oxidation of an electrode or the like. In addition, in view of a function as a wiring material, an electrode of alloy narrows down the choices of material for the electrode.

Thus, in order to attain a low driving voltage without using a material having a small work function for a cathode, studies has been made to provide an electron injection layer between a cathode and a light emitting layer, wherein an alkali metal or an alkaline-earth metal is used for the electron injection layer. For example, Japanese Patent Application Laid-Open (JP-A) No. Hei. 09-17574 discloses that an electron injection layer contains an alkali metal compound, which is an inorganic compound such as LiF, $Li_2O$ or the like. However, since the alkali metal compound of an inorganic compound has an insulating property, it is necessary to form a very thin layer thereof. Hence, it is hard to form a layer by a vapor deposition, thus, it is difficult to obtain an element which exhibits stable performance even though the element is used repeatedly.

Also, for example, JP-A No. 2000-91078 discloses an electron injection layer made from an organic salt or an organometallic complex of an alkali metal or an alkaline-earth metal. JP-A No. 2000-243569 discloses that an electron injection layer made of an organometallic compound containing an alkali metal. JP-A No. 2003-303691 discloses a second cathode containing metal carboxylic acid containing an alkali metal or an alkaline-earth metal. Also, JP-A No. Hei. 11-233262 discloses an organic layer adjacent to a cathode is composed of an organometallic complex compound containing at least one kind selected from the group consisting of an alkali metal ion, an alkaline-earth metal ion and a rare-earth metal ion, and the cathode is made of a metal which can reduce the metal ion contained in the complex compound to the metal under vacuum condition. Further, JP-A No. Hei. 10-270171 discloses attainment of a low driving voltage by having an organic compound layer doped with a metal which functions as a donor (electron donating) dopant at an interface of a cathode so as to lower the energy gap upon electron injection. However, in all of the prior arts, a layer needs to be formed by a vapor deposition under vacuum condition, therefore, the production process takes a long time.

Other than the organic EL element, as a representative example of an organic electronic device using an organic material having certain degree of carrier, mobility, there may be an organic solar battery or the like.

The organic solar battery utilizes, so to speak, a mechanism opposite to an organic EL element. That is, the most basic constitution of the organic solar battery is the same as that of an organic EL element, which is a structure having an organic thin film having a two layer structure disposed between electrodes (see "App. Phys. Lett.", (1986), Vol. 48, Number 2, p. 183-185). An electromotive force can be obtained by utilizing photocurrent which is generated when the organic thin film absorbs light. The electric current at this time may be considered that a carrier generated by light flows utilizing the carrier mobility of an organic material. If a charge injection barrier of the organic material and the electrodes lowers, an electromotive force can be obtained more efficiently.

An organic transistor, which is another representative example of the organic electronic device, is a thin film transistor using an organic semiconductor material comprising an organic polymer or an organic small molecule compound having a π conjugated system for a channel area. A general organic transistor comprises a substrate, a gate electrode, a gate insulating layer, source and drain electrodes and an organic semiconductor layer. In an organic transistor, switching is performed by changing a voltage (gate voltage) applied to the gate electrode so that a quantity of electric charge of an interface of a gate insulating layer and an organic semiconductor layer is controlled and a current value between a source electrode and a drain electrode is changed.

However, when the organic semiconductor material used in the organic transistor is employed, a charge injection barrier between the organic semiconductor material and the source electrode or the drain electrode is large, thus causing a problem in driving an element. Also, if a charge injection barrier between the organic semiconductor layer and the source electrode or the drain electrode can be lowered, it is expected that an on-current value of the organic transistor improves and an element characteristic stabilizes.

On the other hand, an organic electronic device such as the organic EL element or the like having the light emitting layer, the charge transporting layer or the like foamed by a wet film forming method (spin coating method, printing method, ink jet method or the like), which comprises solving or dispersing a polymer organic compound having luminescence, charge transporting property or the like in a solvent and applying on a substrate, is proposed. The wet film forming method, in which a material is applied on a substrate using a solvent, does not need a large-scale vapor deposition apparatus in comparison with a vacuum vapor deposition method and can expect simplification of a production process. In addition, the wet film forming method has the advantages such as high usability efficiency of material, low cost and capability of increasing area of a substrate. The wet film forming method also has the advantage that materials are easily coated separately in a line, for example, RGB or the like of an organic EL element.

SUMMARY OF THE INVENTION

JP-A No. Hei. 11-233262 discloses that it is known that an alkali metal and alkaline-earth metal generally exhibits higher saturated vapor pressure than a metal having high melting point such as Al or the like and the compound thereof can be reduced by metals having the high melting point such as Al, Si, Zr or the like at a reaction temperature of oxidation-reduction reaction, and discloses a problem that when an organometallic complex containing an alkali metal or an alkaline-earth metal is used for an electron injection layer, good properties cannot be obtained unless a thermally reducible material such as Al or the like is vapor deposited under vacuum condition as a cathode on the layer containing the alkali metal or the alkaline-earth metal and thermally reducible material reduces a metal ion contained in the organometallic complex containing the alkali metal or the alkaline-earth metal to a metal under vacuum condition. It is also reported that a salt of carboxylic acid such as benzoic acid, acetic acid or the like containing an alkali metal or an alkaline-earth metal is decomposed by heat in forming a layer by a vapor deposition, and deposited as the alkali metal element or the alkaline-earth metal element ("Extended Abstracts (The 50th Spring Meeting); The Japan Society of Applied Physics and Related Societies.", 2003, p. 1404).

Also, as an applying-type electron injection layer, materials are proposed by "App. Phys. Lett.", (2003), Vol. 83, Number 23, p. 4695-4697. In the document, a thermally reducible Al is used as a cathode on an electron injection layer, and Al is formed a film by vapor deposition under vacuum condition. There is a problem that the properties cannot be exhibited by a cathode which uses a metal having low thermally reducing ability and large work function on the applying-type electron injection layer in the document.

All of the organic salt and the organometallic complex containing an alkali metal or an alkaline-earth metal disclosed in JP-A No. 2000-91078, JP-A No. 2000-243569, JP-A No. 2003-303691, JP-A No. Hei. 11-233262 and "App. Phys. Lett.", (2003), Vol. 83, Number 23, p. 4695-4,697 are an organic salt or an organometallic complex, in which oxygen is directly bonded to an alkali metal or an alkaline-earth metal. This may be a reason of the problem that good properties as an element cannot be obtained unless a thermally reducible material such as Al or the lie is vapor deposited under vacuum condition as a cathode on the organic salt or the organometallic complex containing an alkali metal or an alkaline-earth metal, and thermally reducible material reduces a metal ion contained in the organometallic complex containing the alkali metal or the alkaline-earth metal under vacuum condition to a metal. It can be considered that it is because when the organic salt or the organometallic complex in which oxygen is directly bonded to an alkali metal or an alkaline-earth metal is used, an electron localized on the oxygen is difficult to be emitted to a neutral organic material, therefore, even if the organic salt or the organometallic complex contacts with an organic material directly, since charge transfer is difficult to be performed between the neutral organic material and the organic salt or the organometallic complex, the effect of charge injection is small, and charge transfer is easily performed between the neutral organic material and the organic salt or the organometallic complex due to reduction to the alkali metal or the alkaline-earth metal. Hence, by a conventional technique, there is a limit in a method for forming an electron injection layer and/or a material of an adjacent electrode or a method for forming thereof. Therefore, it is difficult to form a layer and an electrode containing an alkali metal or an alkaline-earth metal by a wet film forming method without using a vapor deposition method.

As aforementioned, an organic EL element is explained, however, similarly for an organic light emitting device other than the organic EL element such as light emitting electrochemical cells (LECs) and an electrochemiluminescence (ECL) (for example, "Synthetic Metals", (1997), vol. 85, p. 1,229-1,232), and further an organic electronic device such as an organic transistor, an organic solar battery or the like, it is important to lower a charge injection barrier between an electrode and an organic layer so that a charge injection is efficient. Also, it is important that the devices can be produced easily by a wet film forming method and efficiently.

The present invention has been achieved in light of the above-stated conventional problems. A main object of the present invention is to provide an organic electronic device which has a high charge injection property by lowering a charge injection barrier between an electrode and an organic layer, and in which the layer having a charge injection function can be formed by a wet film forming method, and a method for producing the same.

A first embodiment of an organic electronic device of the present invention is an organic electronic device comprising a substrate, two or more electrodes facing each other disposed on the substrate and at least one organic layer disposed between two electrodes among the electrodes, wherein a layer containing a reactive organic compound and/or a reaction product thereof is disposed between at least one electrode and an organic layer containing a charge injection, transporting material.

A second embodiment of an organic electronic device of the present invention is an organic electronic device comprising a substrate, two or more electrodes facing each other disposed on the substrate and at least one organic layer disposed between two electrodes among the electrodes, wherein at least one electrode and/or an organic layer containing a charge injection transporting material disposed adjacent to the electrode contains a reactive organic compound and/or a reaction product thereof.

In the present invention, a reactivity of the reactive organic compound means a reactivity of the reactive organic compound with the charge injection transporting material. Hence, the reaction product in the present invention means a reaction product obtained by a reaction of the reactive organic compound and the charge injection transporting material.

The organic electronic device of the present invention in the first embodiment has the layer containing a reactive organic compound and/or a reaction product thereof disposed between at least one electrode and an organic layer containing a charge injection transporting material. In the second embodiment, at least one electrode and/or the organic layer containing a charge injection transporting material disposed adjacent to the electrode contains a reactive organic compound and/or a reaction product thereof. Therefore, the charge injection transporting material formerly being neutral produces a radical anion or a radical cation by a reaction with the reactive organic compound to increase a charge density, thus, a charge injection barrier between the electrode and the organic layer lowers so that a charge can be injected efficiently.

Also, the organic electronic device of the present invention can exhibit a good charge injection function upon containing the reactive organic compound without using a vapor deposition method, thus, the reactive organic compound can be contained by a wet film forming method. Further, there is no limit in a material of an adjacent electrode or a forming method.

From the view point of electron injection between the electrode and the organic layer which transfer an electron, it is preferable that the charge injection transporting material is an electron injection transporting material.

It is preferable that the reactive organic compound has a reducing portion or a proton accepting portion since by reducing the charge injection transporting material formerly being neutral or by accepting a proton from the charge injection transporting material, the charge injection transporting material formerly being neutral can be in a radical anion state, that is, a carrier, thereby, a charge injection barrier from an electrode lowers so as to improve an electron injection property.

A charge of the reducing portion or the proton accepting portion of the reactive organic compound may be neutral as a reaction product of the reactive organic compound.

It is preferable that an electron affinity of the reducing portion or the proton accepting portion of the reactive organic compound is smaller than an electron affinity of the charge injection transporting material since the reducing portion of the reactive organic compound becomes easy to provide an electron to the charge injection transporting material or the proton accepting portion of the reactive organic compound becomes easy to accept a proton from the charge injection transporting material so as to be easy to form a molecule in a radical anion state, thereby, an electron injection property improves.

From the viewpoint of improvement in charge injection property, it is preferable that the reaction product is a charge transfer complex formed from a part of the reactive organic compound, and further, it is preferable that the reaction product is a charge transfer complex formed from a part of the reactive organic compound and the charge injection transporting material.

It is preferable that the reducing portion or the proton accepting portion of the reactive organic compound contains at least one kind of compound selected from the group consisting of a boron compound, a silicon compound, a nitrogen compound, a phosphorus compound, a sulfur compound, a selenium compound, a tellurium compound, a cyclic hydrocarbon compound, a nitrogen-containing cyclic compound, a sulfur-containing cyclic compound, a selenium-containing cyclic compound, a tellurium-containing cyclic compound, and a condensed polycyclic compound thereof since a reaction between the reactive organic compound and the charge injection transporting material easily occurs so as to improve a charge injection property.

From the viewpoint of improvement in charge injection property, the reactive organic compound is preferably at least one kind of compound selected from the group consisting of a metallic amide compound, a metallic cyclopentadiene compound, a cyclopentadiene compound, a phenanthroline compound, a phenanthridine compound, a naphthalen compound, a bipyridyl compound, a phenylpyridine compound, a quinoline compound and a pyridine compound.

The reactive organic compound preferably contains a metal element since the charge transfer complex is stably formed so as to improve an electron injection property.

As one embodiment of the organic electronic device of the present invention, the organic electronic device may be an organic light emitting device having a structure of the organic electronic device and containing a light emitting material.

Also, the organic light emitting device may be the organic light emitting device which has multiple light emitting units containing at least one light emitting layer between an anode and a cathode facing each other, the light emitting units being individually separated by a charge generating layer, and the charge generating layer and/or an organic layer containing a charge injection transporting material disposed adjacent to the charge generating layer contains a reactive organic compound and/or a reaction product thereof. In this case, by laminating multiple light emitting units in series, a high luminance, a high light emitting efficiency (electric current efficiency) and a long life span can be obtained.

On the other hand, a first embodiment of a method for producing an organic electronic device of the present invention comprising a substrate, two or more electrodes facing each other disposed on the substrate and at least one organic layer disposed between two electrodes among the electrodes, comprises a step of forming a layer containing a reactive organic compound between at least one electrode and an organic layer containing a charge injection transporting material.

A second embodiment of a method for producing an organic electronic device of the present invention comprising a substrate, two or more electrodes facing each other disposed on the substrate and at least one organic layer disposed between two electrodes among the electrodes, comprises a step of forming a layer containing a reactive organic compound as at least one electrode and/or an organic layer containing a charge injection transporting material disposed adjacent to the electrode.

It is preferable that the layer containing the reactive organic compound is formed by a wet film forming method since a vacuum device is not necessary, a production process can be simplified, material can be used efficiently low cost can be attained, and an area of a substrate can be increased.

Further, it is preferable for the method to comprise a step that the reactive organic compound and the charge injection transporting material form a reaction product since due to a reaction of the charge injection transporting material formerly being neutral with the reactive organic compound, a charge injection barrier between the electrode and the organic layer lowers so that a charge can be injected efficiently.

From the viewpoint of improvement in charge injection property, it is preferable that the organic electronic device is an organic light emitting device having multiple light emitting units containing at least one light emitting layer between an anode and a cathode facing each other, the light emitting units being individually separated by a charge generating layer, and the method comprises a step of forming a layer containing a reactive organic compound as the charge generating layer and/or the organic layer adjacent to the charge generating layer.

Aforementioned organic electronic device of the present invention has effects that the charge injection barrier between an electrode and an organic layer lowers to have a high charge injection property, and the layer having a charge injection function can be formed by a wet film forming method.

According to the present invention, an organic electronic device, wherein not only a charge injection transporting layer but also all layers including other organic layers, electrodes and the like can be formed by a wet film forming method, therefore, a large-scale vapor deposition apparatus is not necessary in comparison with a vacuum vapor deposition method, simplification of a production process can be expected, material can be utilized efficiently, low cost can be attained, and increase of an area of a substrate is possible, can be obtained. Further, an organic electronic device, which has the advantage that materials are easily coated separately in a line in plural thin layers, for example, a light emitting layer of RGB or the like of an organic EL element, and at the same time, which has a good charge injection efficiency so as to have a good element characteristic, can be obtained.

Particularly, in the case of an organic light emitting device, a cathode can also be formed easily and efficiently by a wet process, which has been difficult to attain with a conventional organic light emitting device, and a good organic light emitting property can be attained even if a metal having a large work function is used for the cathode. In the present invention, there is no limit in material or a forming method of an adjacent electrode. For example, even if an electrode using a metal which is not thermally reducible and has a large work function is formed or an electrode is formed by coating on an organic layer containing the reactive organic compound formed by a wet film forming method, charge injection to the organic layer can be efficiently performed and a good element characteristic can be obtained. Further, the present invention can be suitably used for forming an electron injection transporting layer in the case of forming an organic EL element from a cathode, and for a top emission (top surface light emission) element, which emits light from a cathode side using a transparent electrode as a cathode, since it is not necessary to vapor deposit a thermally reducible electrode material on a charge injection material.

A method for producing an organic electronic device of the present invention can improve a charge injection function using only a step of forming layers by a wet film forming method by having a step of forming a layer containing a reactive organic compound between at least one electrode and an organic layer containing a charge injection transporting material, or a step of forming a layer containing a reactive organic compound as at least one electrode and/or an organic layer containing a charge injection transporting material disposed adjacent to the electrode.

BRIEF DESCRIPTION OF THE DRAWINGS

In the accompanying drawings.

Figure 1:
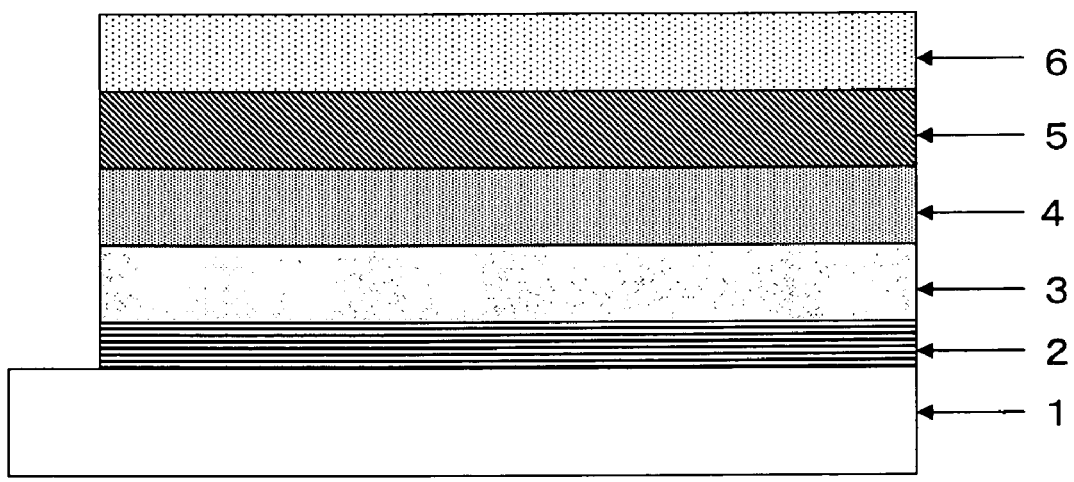
FIG. 1 is a cross-sectional view showing an example of an organic EL element of the present invention.

The numerical symbol in each figure refers to the following: 1: substrate; 2: anode; 3: positive hole injection transporting layer; 4: light emitting layer; 5: electron injection transporting layer; 6: cathode; 20: organic transistor; 21: substrate; 22: gate electrode; 23: insulating layer; 24: organic semiconductor layer; 25: source electrode; 26: drain electrode; 27: charge injection layer; 31: substrate; 32: first electrode; 33: positive hole injection layer; 34: positive hole transporting layer; 35: electron transporting layer; 36: electron injection layer; and 37: second electrode.

DETAILED DESCRIPTION OF THE INVENTION

A first embodiment of an organic electronic device of the present invention is an organic electronic device comprising a substrate, two or more electrodes facing each other disposed on the substrate and at least one organic layer disposed between two electrodes among the electrodes, wherein a layer containing a reactive organic compound and/or a reaction product thereof is disposed between at least one electrode and an organic layer containing a charge injection transporting material. It is preferable that the layer containing a reactive organic compound and/or a reaction product thereof is formed adjacent to at least one electrode and the organic layer containing a charge injection transporting material and between at least one electrode and the organic layer containing a charge injection transporting material.

A second embodiment of an organic electronic device of the present invention is an organic electronic device comprising a substrate, two or more electrodes facing each other disposed on the substrate and at least one organic layer disposed between two electrodes among the electrodes, wherein at least one electrode and/or an organic layer containing a charge injection transporting material disposed adjacent to the electrode contains a reactive organic compound and/or a reaction product thereof.

In the present invention, the charge injection transporting material is a material which can stabilize an electron and/or a positive hole injection from an electrode, and transport the electron and/or the positive hole injected from the electrode. When applying electric field, the charge injection transporting material may have either an electron and/or a positive hole injection property having a function of stabilizing an electron and/or a positive hole injection from an electrode or an electron and/or a positive hole transporting property having a function of transporting an electron injected from an electrode by force of electric field, or may have both functions of an electron and/or a positive hole injection property and an electron and/or a positive hole transporting property. The charge injection transporting material in the present invention includes a so-called light emitting material having an electron transporting property and a positive hole transporting property.

Also, as aforementioned, in the present invention, a reactivity of the reactive organic compound means a reactivity with the charge injection transporting material. Hence, the reaction product in the present'invention means a reaction product obtained by reacting the reactive organic compound and the charge injection transporting material.

In the first embodiment, the organic electronic device of the present invention has a layer containing a reactive organic compound and/or a reaction product thereof between at least one electrode and an organic layer containing a charge injection transporting material. In the second embodiment of the organic electronic device of the present invention, at least one electrode and/or an organic layer containing a charge injection transporting material disposed adjacent to the electrode contains a reactive organic compound and/or a reaction product thereof. Therefore, the charge injection transporting material formerly being neutral produces a radical anion or a radical cation by a reaction with the reactive organic compound to increase charge density, thus, a charge injection barrier between the electrode and the organic layer lowers so that a charge can be injected efficiently.

Also, the organic electronic device of the present invention can exhibit a good charge injection function upon containing the reactive organic compound without using a vapor deposition method, thus, the reactive organic compound can be contained by a wet film forming method. Further, there is no limit in material of an adjacent electrode or a forming method.

In the organic electronic device of the first embodiment, the layer containing a reactive organic compound and/or a reaction product thereof may be formed between at least one electrode and an organic layer containing a charge injection transporting material, as exemplified below, so as to contact whole surface with the electrode and/or the layer containing a charge injection transporting material, or may be formed in an island shape on the layer containing a charge injection transporting material between the electrode and the organic layer containing a charge injection transporting material. Also, the reaction product is obtained by reacting the reactive organic compound and the charge injection transporting material contacting the reactive organic compound. Hence, the reaction product may be contained not only between at least one electrode and the organic layer containing a charge injection transporting material but also in the organic layer containing a charge injection transporting material.

In the second embodiment of the organic electronic device, as an embodiment of containing the reactive organic compound and/or the reaction product thereof, there may be an embodiment that the reactive organic compound and/or the reaction product thereof is dispersed in the organic layer containing a charge injection transporting material disposed adjacent to an electrode, or is dispersed in an electrode contacting the organic layer to be diffused in the organic layer while driving. Further, the reactive organic compound and/or the reaction product thereof may be dispersed in both electrode and organic layer containing a charge injection transporting material disposed adjacent to the electrode to be contained.

<Reactive Organic Compound and Reaction Product>

Hereinafter, first, the reactive organic compound and the reaction product used in the present invention will be explained.

In order to lower an electron injection barrier from an electrode, it is preferable that the reactive organic compound has a reducing portion or a proton accepting portion. If the reactive organic compound has a reducing portion or a proton accepting portion, the reactive organic compound reacts with a charge injection transporting material so that the charge injection transporting material formerly being neutral can produce a radical anion, and a charge density of the charge injection transporting material increases. Thus, an organic electronic device in which an electron can be injected efficiently can be produced. Even though an alkali metal or the like is not reduced to be a metal element by vapor deposition or the like of a thermally reducible material upon forming of an adjacent electrode layer or an electron injection material itself as conventional, since charge transfer between the formerly neutral charge injection transporting material and the reactive organic compound is easily performed, an organic electronic device having a good electron injection function can be produced without using a vapor deposition method.

On the other hand, in order to lower a positive hole injection barrier from an electrode, the reactive organic compound preferably has an oxidizing portion or a proton donating portion. If the reactive organic compound has an oxidizing portion or a proton donating portion, the reactive organic compound reacts with a charge injection transporting material so that the formerly neutral charge injection transporting material can produce a radical cation, and a charge density of the charge injection transporting material increases. Thus, an organic electronic device in which a positive hole can be injected efficiently can be produced.

Generally, the reducing portion or the proton accepting portion, or the oxidizing portion or the proton donating portion of the reactive organic compound has a negative charge or a positive charge. It is preferably that a charge is neutral by the reaction with the charge injection transporting material. In this case, a charge density of the formerly neutral charge injection transporting material increases so as to improve charge injection efficiency.

Further, it is preferable that the reactive organic compound reacts to form a charge transfer complex from a part of the reactive organic compound as the reaction product. Particularly, the reaction product is preferably a charge transfer complex formed from a part of the reactive organic compound and the charge injection transporting material. If a part of the reactive organic compound forms the charge transfer complex, a new energy level is formed in the charge injection transporting material so as to lower an injection barrier from an electrode, thus, a charge injection property improves.

The charge transfer complex may be formed in such a manner that, for example, the reducing portion or the proton accepting portion, or the oxidizing portion or the proton donating portion of the reactive organic compound reacts with a formerly neutral charge injection transporting material, a charge of the reducing portion or the proton accepting portion, or the oxidizing portion or the proton donating portion of the reactive organic compound becomes neutral. The charge injection transporting material becomes a radical anion or a radical cation so that a part of the reactive organic compound different form the reducing portion or the proton accepting portion, or the oxidizing portion or the proton donating portion of the reactive organic compound forms a charge transfer complex with the radical anion or the radical cation of the charge injection transporting material.

It is possible to confirm that a charge transfer complex is formed between a part of the reactive organic compound and the charge injection transporting material in the present invention from an absorption spectrum measured by means of an absorption spectrometer (for example, UV-3100PC; manufactured by Shimadzu Corporation) by a new absorption peak different from the absorption peak of the reactive organic compound or the charge injection transporting material generated on the longer wavelength side.

Also, it is possible to confirm that the charge transfer complex is formed from a fluorescent spectrum measured by means of a fluorospectrometer (for example, F-4500; manufactured by HITACHI) by the decline of a fluorescent intensity at a light emission peak or a shift of the light emission peak observed in comparison with the fluorescent intensity or wavelength of the light emission peak of the charge injection transporting material. These methods for confirming formation of the charge transfer complex can be a guide for selecting a combination of the charge injection transporting material and the reactive organic compound.

i) Reactive Organic Compound Suitable for Electron Injection

In order to lower an electron injection barrier from an electrode, it is preferable that the reactive organic compound has a reducing portion or a proton accepting portion. Further, it is preferable that an electron affinity of the reducing portion or the proton accepting portion of the reactive organic compound is smaller than an electron affinity of the charge injection transporting material. In this case, it becomes easy for the reducing portion of the reactive organic compound to provide an electron to the charge injection transporting material, or it becomes easy for the accepting portion of the reactive organic compound to accept a proton from the charge injection transporting material, so that it becomes easy to generate a radical anion state, that is, to produce a charge, thereby, an electron injection property improves.

Further, an electron affinity of the reducing portion or the proton accepting portion of the reactive organic compound may be in the range of 1.0 eV from a value of an electron affinity of the charge injection transporting material. That is, a value may be ±1.0 eV or less when a value of an electron affinity of the reducing portion or the proton accepting portion of the reactive organic compound is subtracted from a value of an electron affinity of the charge injection transporting material.

An electron affinity of the reducing portion or the proton accepting portion of the reactive organic compound is preferably 3.5 eV or less, more preferably 3.0 eV or less, from the viewpoint of providing an election to the charge injection transporting material (production of a radical anion).

The reactive organic compound may be suitably used if a reactive organic compound has a reducing portion or a proton accepting portion and may not be particularly limited. An organic salt or an organometallic complex having a reducing portion or a proton accepting portion may be suitably used. In the case of the organic salt or the organometallic complex, by an ion polarized at an interface of an electrode due to a dissociated organic salt and/or organometallic complex, or by an organic salt and/or an organometallic complex as-is interposed at an interface of an electrode, an electric double layer is formed so as to lower an injection barrier, thereby, an electron can be efficiently injected.

As the reducing portion or the proton accepting portion, there may be not limited if it is a portion which can reduce the charge injection transporting material or accept a proton from the charge injection transporting material. For example, such a portion can be represented by (X—R) comprising a portion (X) which can become negatively charged and other portion (R). The portion (X) which can become negatively charged is an atom or an aromatic atomic group having a delocalized π electron which can directly form an ionic bond or a coordinate bond with a part of the reactive organic compound different from the reducing portion or the proton accepting portion (generally, a portion which can be positively charged).

As the atom constituting the portion (X) which can become negatively charged of the reducing portion or the proton accepting portion, from the viewpoint of becoming easy to have a property which can reduce the charge injection transporting material, an atom which has a valency larger than, 2 is preferable, there may be nonmetallic elements such as Group 13 elements, Group 14 elements, Group 15 elements and Group 16 elements other than oxygen. Specifically, there may be, for example, B, C, N, Si, P, S, Se and Te.

Also, as the aromatic atomic group having a delocalized π electron constituting the portion (X) which can become negatively charged of the reducing portion or the proton accepting portion, from the viewpoint of becoming easy to have a property which can reduce the charge injection transporting material, there may be at least one kind of compound selected from the group consisting of a cyclic hydrocarbon compound, a nitrogen-containing cyclic compound, a sulfur-containing cyclic compound, a selenium-containing cyclic compound, a tellurium-containing cyclic compound, and a condensed polycyclic compound thereof. As the aromatic atomic group having a delocalized π electron constituting the portion (X) which can become negatively charged, specifically, there may be cyclopentadiene, cycloheptathorium, phenanthroline, phenanthridine, naphthalene, bipyridyl, phenylpyridine, quinoline, pyridine, pyrrole, thiophene, selenophene, cyclooctatetraene or the like.

In the case that the portion (X) which can become negatively charged comprises the atoms or the aromatic atomic group, it is presumed that since it becomes possible to bond with more electron donating substituents or the like to be hereinafter described, an electron density of the portion (X) which can become negatively charged increases so that it becomes easy for the reducing portion to provide an electron to a neutral charge injection transporting material, or it becomes easy for the proton accepting portion to accept a proton from the neutral charge injection transporting material, thereby, a electron injection function becomes excellent.

Therefore, it is preferable, from the viewpoint of charge injection property, that the reducing portion or the proton accepting portion of the reactive organic compound contains at least one kind of compound selected from the group consisting of a boron compound, a silicon compound, a nitrogen compound, a phosphorus compound, a sulfur compound, a selenium compound, a tellurium compound, a cyclic hydrocarbon compound, a nitrogen-containing cyclic compound, a sulfur-containing cyclic compound, a selenium-containing cyclic compound, a tellurium-containing cyclic compound, and a condensed polycyclic compound thereof.

Among them, particularly, the reducing portion or the proton accepting portion of the reactive organic compound may be preferably a nitrogen compound, a cyclopentadiene compound, a phenanthroline compound and a phenanthridine compound.

As for other portion (R) bonded to the portion (X) which can become negatively charged of the reducing portion or the proton accepting portion, there may be not particularly limited, but it is preferable that other portion (R) has at least one kind of electron donating group selected from the group consisting of a hydrogen atom, an alkyl group, an alkoxy group, an aryl group and a hydroxy group. In the case of having the electron donating group, an electron density of the portion (X) which can become negatively charged increases so that it becomes easy for the a reducing portion or the proton accepting portion to reduce the charge injection transporting material, thereby, an electron injection property improves. Particularly, it is preferable that the electron donating group is directly bonded to the portion (X) which can become negatively charged.

The alkyl group or the aryl group may also include a group thereof having a further substituent such as an alkoxy group, a hydroxyl group or the like bonded theteto. As the alkyl group, there may be a straight-chain alkyl group and a branched-chain alkyl group. Specifically, there may be a methyl group, an ethyl group, an n-propyl group, an isopropyl group, an n-butyl group, an isobutyl group, a sec-butyl group, a tert-butyl group or the like. Also, the alkyl group includes an arylated alkyl group, which is an alkyl group having an aryl group substituted for a hydrogen atom. As the aryl group, there may be a phenyl group, a naphthyl group, a tolyl group, a biphenyl group, a triphenyl group or the like. Moreover, the aryl group includes an alkylated aryl group, which is an aryl group having an alkyl group substituted for hydrogen atom. As the alkoxy group, there may be a straight-chain alkoxy group and a branched-chain alkoxy group. Specifically, there may be a methoxy group, an ethoxy group, an n-propoxy group, an isopropoxy group, an n-butoxy group, an isobutoxy group, a sec-butoxy group, a tert-butoxy group or the like.

Also, other portion (R) bonded to the portion (X) which can become negatively charged of the reducing portion or the proton accepting portion may be a small molecular weight compound or a polymer. As a case of a small molecular weight compound, there may be a case that other portion (R) comprises the electron donating group and a case that other portion (R) comprises a small molecular weight material having the electron donating group. As a case that other portion (R) is a polymer, there may be an embodiment in which the portion (X) which can become negatively charged is bonded to a principal chain, a side chain or a branched chain of a polymer. In the polymer, a medium molecular weight compound such as a so-called dendritic multiple branching molecule material (dendrimer) may be included. The said branched chain means a branched chain three-dimensionally surrounding a core molecule of a dendritic multiple branching molecule material (dendrimer).

The reducing portion or the proton accepting portion may have a structure in which the charge injection transporting material is contained in other portion (R), that is, a structure in which the reducing portion or the proton accepting portion of the reactive organic compound and the charge injection transporting material are bonded.

On the other hand, among the reactive organic compounds suitable for electron injection, a part different from the reducing portion or the proton accepting portion is preferably able to become positively charged. In this case, a charge transfer complex can be formed between a portion which can become positively charged and a reduced charge injection transporting material. From the viewpoint of stably forming the charge transfer complex and an electron injection function, the reactive organic compound preferably contains a metal element as a part different from the reducing portion or the proton accepting portion. Particularly, it is preferable to contain a metal element which can be a monovalent, divalent or trivalent positive ion.

From the viewpoint of forming a charge transfer complex, the reactive organic compound suitable for electron injection preferably contains a metal having a small work function. It is preferable that the reactive organic compound containing a metal having a work function of 4.2 eV or less, more preferably 3.5 eV or less.

On the other hand, from the viewpoint of handleability, the reactive organic compound suitable for electron injection may contain a metal having a large work function such as a transition metal since a reactive organic compound having a small work function needs to be handled in an inert gas atmosphere due to the high reactivity with moisture, however, a metal having a large work function such as a transition metal can be stably handled in the air.

Therefore, it is preferable that the reactive organic compound suitable for electron injection contains at least one kind selected from the group consisting of an alkali metal, an alkaline-earth metal, a rare-earth element and a transition metal.

As the alkali metal, there may be Li, Na, K, Rb, Cs or the like. As the alkaline-earth metal, there may be Mg, Ca, Sr, Ba or the like. Also, as the rare-earth element, there may be Sc, Y or lanthanoide element. As the transition metal, there may be Ti, V, Cr, Mn, Fe, Co, Ni, Cu, Zn or the like.

As aforementioned, among the above, from the viewpoint of an excellent electron injection function, it is preferable that the reactive organic compound suitable for electron injection is at least one selected from the group consisting of a metallic amide compound, a metallic cyclopentadiene compound, a cyclopentadiene compound, a phenanthroline compound, a phenanthridine compound, a naphthalene compound, a bipyridyl compound, a phenylpyridine compound, a quinoline compound and a pyridine compound.

The metallic amide compound is a compound in which one hydrogen atom of ammonia or amine substituted by a metal atom. In the case of the metallic amide compound, a reducing portion or a proton accepting portion is a nitrogen compound, in which N (nitrogen) corresponds to the portion (X) which can become negatively charged.

If it is a metallic amide compound, any derivatives may be used. Any of the above may be used for other portion (R) bonded to nitrogen (X). As a suitable electron'donating group of other portion (R), there may be a hydrogen atom, an alkyl group, an aryl group or the like. Among them, from the viewpoint of being soluble in an organic solvent and excellence in stabilization of an organic salt or an electron injection function, an alkyl group and an aryl group are preferable. As a preferable metallic amide compound, particularly, there may be exemplified a compound in which two groups among an alkyl group and aryl group are bonded to nitrogen. An electron donating group such as an alkoxy group, a hydroxy group or the like may be further bonded to the alkyl group or the aryl group. Also, the above mentioned polymer may be bonded directly or via a substituent such as an alkyl group, an aryl group or the like to nitrogen.

From the viewpoint of an electron injection function (charge transfer complex formation), it is preferable that the metallic amide compound is, particularly, an amide compound containing a metal such as an alkali metal, an alkaline-earth metal or a rare-earth element metal.

As the metallic amide compound, specifically, there may be lithium dialkylamide such as lithium dimethylamide, lithium diethylamide, lithium diisopropylamide, lithium dibutylamide or the like; potassium dialkylamide such as potassium dimethylamide, potassium diethylamide, potassium diisopropylamide or the like; sodium dialkylamide such as sodium dimethylamide, sodium diethylamide, sodium diisopropylamide or the like; rubidium dialkylamide; cesium dialkylamide or the like.

Moreover, the metallic cyclopentadiene compound is a compound containing a metal and cyclopentadiene. In the case of the metallic cyclopentadiene compound, a reducing portion or a proton accepting portion is a cyclic hydrocarbon compound in which cyclopentadiene corresponds to the portion (X) charged negatively as mentioned above. The metallic cyclopentadiene compound includes a sandwiched-type compound in which a metal is sandwiched in between at least two or more cyclopentadienes. The metal of the sandwiched compound may not be particularly limited. As the sandwiched compound, for example, there may be bis(cyclopentadienyl)cobalt, bis(cyclopentadienyl)vanadium, bis(cyclopentadienyl)magnesium, bis(cyclopentadienyl)barium, bis(cyclopentadienyl)calcium, bis(cyclopentadienyl)hafnium, bis(cyclopentadienyl)chromium, bis(cyclopentadienyl)iron or the like.

(R) which bonds to cyclopentadiene being the portion (X) which can become negatively charged may be a hydrogen atom, or cyclopentadiene may also be suitably used. A compound in which (R) other than a hydrogen atom is bonded to cyclopentadiene may also be preferably used as the reducing portion or the proton accepting portion. As (R) other than a hydrogen atom, an alkyl group may be suitably used. As number of the alkyl group bonded to cyclopentadiene, more alkyl groups is more preferable from the viewpoint of electron donatability. Specifically, as the reducing portion or the proton accepting portion, a compound such as tetramethylcyclopentadiene, tetraethylcyclopentadiene, isopropylpentadiene, tert-butylcyclopentadiene or the like is preferable.

Particularly, the metallic cyclopentadiene compound may be preferably a metallic cyclopentadiene compound containing an alkali metal, an alkaline-earth metal, a rare-earth element metal or a transition metal from the viewpoint of an electron injection function.

Among the metallic cyclopentadiene compounds, as a compound which is excellent in an electron injection function, for example, there may be cyclopentadienyl lithium derivatives such as tetramethylcyclopentadienyl lithium, tert-butylcyclopentadienyl lithium or the like; cyclopentadienyl sodium derivatives such as tetramethylcyclopentadienyl sodium, isopropylcyclopentadienyl sodium or the like; cyclopentadienyl potassium derivatives such as tetramethyl cyclopentadienyl potassium or the like; bis(cyclopentadienyl) barium derivatives; tris(cyclopentadienyl)erbium derivatives; tris(cyclopentadienyl)cerium derivatives; tris(cyclopentadienyl)yttrium derivatives; tris(cyclopentadienyl) gadolinium; tris(cyclopentadienyl)europium derivatives; tris(cyclopentadienyl)samarium derivatives or the like.

As aforementioned, the metallic cyclopentadiene compound is explained. Since a cyclic compound such as cycloheptathorium, phenanthroline, phenanthridine, naphthalene, bipyridyl, phenylpyridine, quinoline, pyridine, pyrrole, thiophene, selenophene or cyclooctatetraene becomes a ligand of a metal similarly to cyclopentadiene, a similar organometallic compound using the above mentioned cyclic compound instead of cyclopentadiene as a ligand, for example, (naphthalene)calcium derivatives, (phenanthroline)yttrium derivatives, (phenanthroline)europium derivatives, (phenanthroline)samarium derivatives, (phenanthridine)calcium derivatives, (phenanthridine)yttrium derivatives or the like may be suitably used as a reactive organic compound suitable for a charge injection.

ii) Reactive Organic Compound Suitable for Positive Hole Injection

In order to lower a positive hole injection barrier from an electrode, it is preferable that the reactive organic compound has the oxidizing portion or the proton donating portion. Further, an electron affinity of the oxidizing portion or the proton donating portion of the reactive organic compound may be in the range of 1.0 eV from a value of an electron affinity of the charge injection transporting material. That is, a value when a value of an electron affinity of the oxidizing portion or the proton donating portion of the reactive organic compound is subtracted from a value of an ionization potential of the charge injection transporting material may be preferably ±1.0 eV or less since, in this case, the oxidizing portion of the reactive organic compound easily accepts an electron from the charge injection transporting material, or the proton donating portion of the reactive organic compound easily provides a proton to the charge injection transporting material so as to form a charge transfer complex, thus, a positive hole injection property improves.

From the viewpoint of electron transfer and formation of the charge transfer complex, an electron affinity of the oxidizing portion or the proton donating portion of the reactive organic compound is preferably 4.5 eV or more, more preferably 5.0 eV or more.

Similar idea as the reactive organic compound suitable for electron injection as aforementioned may be applied to the reactive organic compound suitable for positive hole injection.

The reactive organic compound having the oxidizing portion or the proton donating portion may be suitably used, and may not be particularly limited. The organic salt or the organometallic complex having the oxidizing portion or the proton donating portion may be suitably used.

As the oxidizing portion or the proton donating portion, there may be not limited, if it is a portion which can oxidize the charge injection transporting material or provide a proton to the charge injection transporting material. For example, such a portion can be represented by (Y—R') comprising a portion (Y) which can become positively charged and other portion (R'). The portion (Y) which can become positively charged is an atom or an aromatic atomic group having a delocalized $\pi$ electron which can directly form an ionic bond or a coordinate bond with a part of the reactive organic compound different from the oxidizing portion or the proton donating portion (generally, a portion which can be negatively charged).

As the atom comprising the portion (Y) which can become positively charged, from the viewpoint of becoming easy to have a property which can oxidize the charge injection transporting material, there may be nonmetal elements such as Group 13 elements, Group 14 elements, Group 15 elements and Group 16 elements other than oxygen. Specifically, there may be B, C, N, Si, P, S, Se or Te. Similarly, as the aromatic atomic group having a delocalized $\pi$ electron comprising the portion (Y) which can become positively charged, there may be at least one kind of compound selected from the group consisting of a cyclic hydrocarbon compound, a nitrogen-containing cyclic compound, a sulfur-containing cyclic compound, a selenium-containing cyclic compound, a tellurium-containing cyclic compound, and a condensed polycyclic compound thereof.

As for other portion (R') bonded to the portion (Y) which can become positively charged, there may be not particularly limited, but it is preferable that other portion (R') has at least one kind of electron accepting group selected from the group consisting of a cyano group, a nitro group, a sulfo group and a substituent containing a Group 17 element.

Other portion (R') bonded to the portion (Y) which can become positively charged may be a small molecular weight compound or a polymer, and the idea similar to the aforementioned (R) can be applied.

On the other hand, it is preferable that a part of the reactive organic compound suitable for positive hole injection different from the oxidizing portion or the proton donating portion may be preferably a portion which can become negatively charged. In this case, a charge transfer complex can be formed between the portion which can become negatively charged and an oxidized charge injection transporting material. From the viewpoint of stably forming the charge transfer complex and a positive hole injection function, the reactive organic compound preferably contains at least one kind selected from the group consisting of halogen and a halogen compound as a part different from the oxidizing portion or the proton donating portion.

As halogen, there may be F, Cl, Br, I or the like. As the halogen compound, there may be $BF_4^-$, $PF_6^-$, $AsF_6^-$, $AsCl_6^-$, $SbF_6^-$ or the like.

As the reactive organic compound suitable for positive hole injection, for example, an organic salt comprising a combination of an arylamine derivative such as triphenyl ammonium, trisbromophenyl ammonium, trischlorophenyl ammonium, trisfluorophenyl ammonium or the like and $BF^{4-}$, $PF_6^-$, $AsF_6^-$, $AsCl_6^-$, $SbF_6$ or the like.

Aforementioned reactive organic compound used in the present invention has a structure as mentioned above and many of which are soluble to a solvent. In this case, a layer can be formed using a wet film forming method.

I. Organic Light Emitting Device

Next, hereinafter an organic light emitting device containing a light emitting material will be explained among the organic electronic devices of the present invention. An organic EL element will be explained in detail as one example of the organic light emitting device, however, the organic light emitting device of the present invention may not be limited to the organic EL element, and can be applied to an organic light emitting device other than the organic EL element such as light emitting electrochemical cells (LECs) or an electrochemiluminescence (ECL).

A first embodiment of an organic light emitting device of the present invention is an organic light emitting device comprising a substrate, two or more electrodes facing each other disposed on the substrate and at least one organic layer including a light emitting layer disposed between two electrodes among the electrodes, wherein a layer containing a reactive organic compound and/or a reaction product thereof is disposed between at least one electrode and an organic layer containing a charge injection transporting material.

A second embodiment of an organic light emitting device of the present invention is an organic light emitting device comprising a substrate, two or more electrodes facing each other disposed on the substrate and at least one organic layer including a light emitting layer disposed between two electrodes among the electrodes, wherein at least one electrode and/or an organic layer containing a charge injection transporting material disposed adjacent to the electrode contains a reactive organic compound and/or a reaction product thereof.

Figure 2:
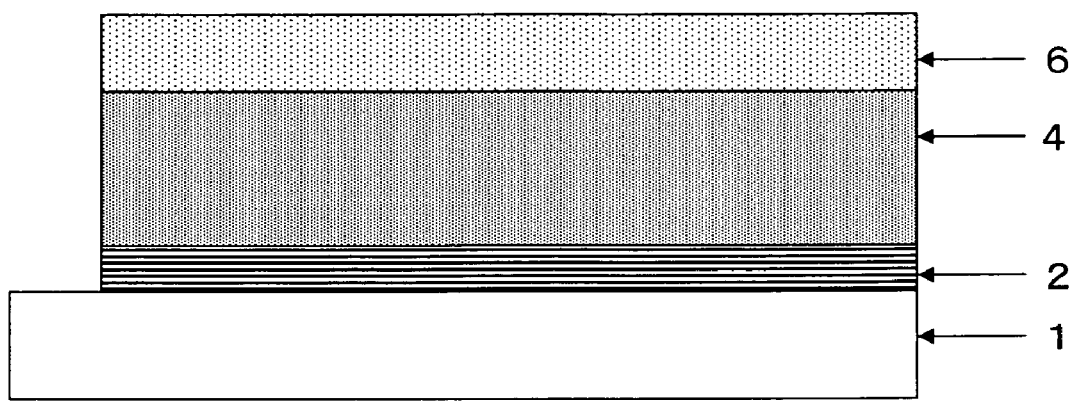
FIG. 2 is a cross-sectional view showing another example of an organic EL element of the present invention.
Figure 3:
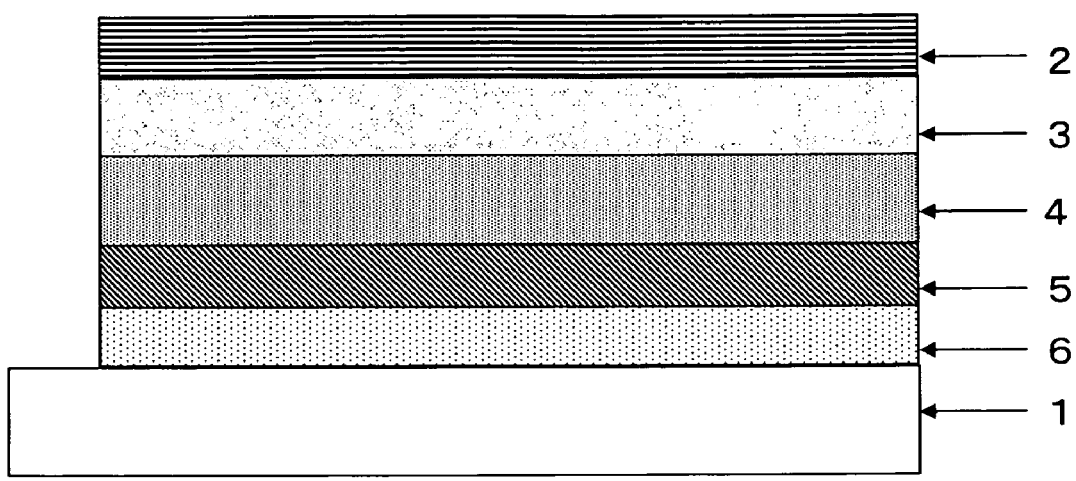
FIG. 3 is a cross-sectional view showing another example of an organic EL element of the present invention.

FIGS. 1 to 3 are cross-sectional views schematically showing examples of a constitution of layers of the organic EL element of the present invention.

As shown in FIG. 1, in one embodiment of the organic EL element of the present invention, a positive hole injection transporting layer 3, a light emitting layer 4 and an electron injection transporting layer 5 which are organic layers are provided in this order between an anode 2 disposed on a substrate 1 and a cathode 6.

As shown in FIG. 2, in other embodiment of the organic EL element of the present invention, a light emitting layer 4 which is an organic layer is provided between an anode 2 disposed on a substrate 1 and a cathode 6.

Further, as shown in FIG. 3, in other embodiment of the organic EL element of the present invention, an electron injection transporting layer alight emitting layer 4 and a positive hole injection transporting layer 3 which are organic layers are provided in this order between a cathode 6 disposed on a substrate 1 and an anode 2.

In the organic light emitting device of the present invention, as the first embodiment having the layer containing a reactive organic compound and/or a reaction product thereof between at least one electrode and the organic layer containing a charge injection transporting material, typically, in the case of a constitution of layers as in FIGS. 1 and 3, the reactive organic compound may be contained as the positive hole injection transporting layer 3 and/or and/or the electron injection transporting layer 5 between the electrode and the light emitting layer, as the result, the reaction product is contained in the positive hole injection transporting layer 3 and/or the electron injection transporting layer 5, at an interface of the positive hole injection transporting layer 3 and/or the electron injection transporting layer 5 and the light emitting layer 4, and further at an interface of the positive hole injection transporting layer 3 and/or the electron injection transporting layer 5 and the cathode 6.

In the organic light emitting device of the present invention, as the second embodiment containing the reactive organic compound and/or the reaction product thereof in at least one electrode and/or the organic layer containing a charge injection transporting material disposed adjacent to the electrode, in the case of a constitution of layers as in FIGS. 1, 2 and 3, the reactive organic compound may be contained in the anode 2 and/or the cathode 6, as the result, the reactive organic compound or the reaction product may be contained at an interface of the electrode and the positive hole injection transporting layer 3 and/or the electron injection transporting layer 5 or the light emitting layer 4, and the positive hole injection transporting layer 3 and/or the electron injection transporting layer 5 or the light emitting layer 4 adjacent to the electrode.

Further, as the second embodiment, in the case of a constitution of layers as shown in FIG. 2, the reactive organic compound may be contained in the light emitting layer 4, as the result, a reaction product is contained at an interface of the light emitting layer 4 and the electrode.

Moreover, as the second embodiment, in the case of a constitution of layers as shown in FIGS. 1 and 3, the reactive organic compound is contained in the charge injection transporting material as forming the positive hole injection transporting layer 3 and/or the electron injection transporting layer 5, as the result, the reaction product is contained at an interface of the electrode and the positive hole injection transporting layer 3 and/or the electron injection transporting layer 5, and at an interface of the positive hole injection transporting layer 3 and/or the electron injection transporting layer 5 and the light emitting layer 4. This case can also correspond to the first embodiment.

Among the embodiments, the embodiment in which a reaction product such as a charge transfer complex is formed at an interface of the electrode is preferable from the viewpoint of a charge injection function.

The above-mentioned constitution is an example of an organic EL element of the present invention, and may not be limited thereto.

Hereinafter, each constitution of the organic EL element will be explained.

1. Organic Layer

An organic layer of the organic EL element of the present invention is formed between an anode 2 and a cathode 6 to be hereinafter described.

The organic layer of the organic EL element of the present invention comprises one or more layers including at least one light emitting layer 4. As a layer formed as the organic layer other than the light emitting layer, there may be a charge injection transporting layer such as an electron injection transporting layer 5 and a positive hole injection transporting layer 3.

(1) Light emitting layer

The light emitting layer 4, which is an organic layer, is a layer wherein a re-coupling of an electron and a positive hole is performed and a light emission occurs. As a light emitting material, if it is a material generally used, it may not be particularly limited. For example, there may be a dye based light emitting material, a metal complex based light emitting material, a polymer based light emitting material or the like. The light emitting material may be used as, as aforementioned, a charge injection transporting material in the present invention. In a light emitting layer, a reactive organic compound and/or a reaction product thereof of the present invention may be further contained.

In the case that the reactive organic compound is further contained in the light emitting layer, there may be a light emitting layer in which the reactive organic compound is dispersed in at lease one or more kinds of light emitting materials, or which contains a light emitting material having the reactive organic compound added to its principal chain, its side chain, its branched chain or the like.

As the dye based light emitting material, for example, there may be cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumarylamine derivatives, oxadiazole dimers, pyrazoline dimers or the like.

As the metal complex based light emitting material, for example, there may be an aluminum quinolinol complex, a benzoquinolinol beryllium complex, a benzoxazole zinc complex, a benzothiazole zinc complex, an azomethyl zinc complex, a porphyrin zinc complex, an europium complex or the like; a metal complex which has Al, Zn, Be or the like or a rare-earth metal such as Tb, Eu, Dy or the like as a central metal, and has a structure such as oxadiazole, thiadiazole, phenylpyridine, phenylbenzimidazole, quinoline or the like as a ligand.

As the polymer light emitting material, for example, there may be poly p-phenylenevinylene derivatives, polythiophene derivatives, poly p-phenylene derivatives, polysilane derivatives, polyacetylene derivatives, polyvinylcarbazole derivatives, polyfluorenone derivatives, polyfluorene derivatives, polyquinoxaline derivatives, copolymers thereof or the like.

In the light emitting layer, an additive such as a dopant or the like may be added for the purpose of improvement in light emitting efficiency, changing a light emitting wavelength or the like. As a dopant, for example, there may be perylene derivatives, coumarin derivatives, rubrene derivatives, quinacridone derivatives, squarylium derivatives, porphyrin derivatives, a styryl dye, tetracene derivatives, pyrazoline derivatives, decacyclene, phenoxazone, quinoxaline derivatives, carbazole derivatives, fluorene derivatives or the like. Also, as a dopant, for example, an organic compound having a structural formula as follows may be used. For example, an organometallic complex which exhibits phosphorescence and has a heavy metal ion in center such as $Ir(ppy)_3$, $(ppy)_2Ir(acac)$, $Ir(BQ)_3$, $(BQ)_2Ir(acac)$, $Ir(THP)_3$, $Ir(THP)_2Ir(acac)$, $Ir(BO)_3$, $(BO)_2(acac)$, $Ir(BT)_3$, $(BT)_2Ir(acac)$, $Ir(BTP)_3$, $(BTP)_2Ir(acac)$ PtOEP or the like may be used. Among them, $Ir(ppy)_3$ is a useful compound as a low-molecular carrier transporting material or a constituent of an organic light emitting layer.

In the present invention, as the light emitting material, either a small molecular weight compound or a polymer which emits fluorescence, or a small molecular weight compound or a polymer which emits phosphorescence may be used. In the case of forming the light emitting layer by a wet film forming method, a polymer which emits fluorescence or a polymer containing a small molecular weight compound which emits fluorescence, or a polymer which emits phosphorescence or a polymer containing a small molecular weight compound which emits phosphorescence may be suitably used.

A thickness of the light emitting layer may not be particularly limited if a light emitting layer can exhibit a function that re-coupling of an electron and a positive hole is performed, in the light emitting layer, for example, a thickness may be about 1 nm to 200 nm.

Also, in the embodiment of the organic EL element in the present invention, it is possible to use a combination of light emitting layers which emit different colorsputterning is necessary when forming a full-color or multi-color display.

As a method for forming the light emitting layer, it is not particularly limited if a method is capable of patterning in high precision. The light emitting layer can be formed by a wet film forming method or a dry process such as a vapor deposition method. As a wet film forming method, there may be a coating method such as a spin coating method, a casting method, a dipping method, a bar coating method, a blade coating method, a roll coating method, a gravure coating method, a flexographic printing method, a spray coating method, a die coating method or the like, or a method of patterning such as printing, an ink jet method or the like, using a melt, a solution or a mixture of material. Among them, it is preferable to use a spin coating method and an ink jet method. In the present invention, the light emitting layer may be preferably formed using the wet film forming method in order to utilize the advantage of the wet film forming method.

(2) Electron Injection Transporting Layer

The electron injection transporting layer 5 is a layer which can stabilize injection of an electron from the cathode 6 or which can stably transport the injected electron to the light emitting layer 4. The electron injection transporting layer 5 may be an electron injection layer which has a function of stabilizing electron injection from the cathode 6 upon applying electric field or an electron transporting layer which has a function of transporting the injected electron from the cathode 6 into the light emitting layer 4 by force of electric field. Or, the electron injection transporting layer 5 may have both functions of an electron injection layer and an electron transporting layer. The electron injection transporting layer may comprise one layer or multiple layers. The electron injection transporting layer 5 is formed, for example, between the light emitting layer 4 and the cathode 6 as shown in FIGS. 1 and 3.

In the present invention, in the case of embodiments of constitution of layers having the electron injection transporting layer 5 as shown in FIGS. 1 and 3, the electron injection transporting layer 5 may preferably contain at least the reactive organic compound from the viewpoint of an excellent electron injection function and improvement in light emitting property. However, in the present invention, in the case that the reactive organic compound is used solely at the positive hole injection transporting side, the electron injection transporting layer 5 may be formed using an electron injection transporting material used conventionally.

The electron injection transporting layer 5 containing the reactive organic compound may be a layer formed solely using the reactive organic compound, but may be a layer having the reactive organic compound dispersed in other electron injection transporting material or may be a layer containing other electron injection transporting material having the reactive organic compound added to its principal chain, its side chain, its branched chain or the like. Further, it may be in a form of laminated layers comprising a layer formed solely using the reactive organic compound and a layer comprising other electron injection transporting material.

Also, in the electron injection transporting layer 5, two or more reactive organic compounds may be contained. In the case that two or more reactive organic compounds are contained in the electron injection transporting layer 5, two or more reactive organic compounds may be separately contained in different layers to form a laminate, or a mixed layer of two or more reactive organic compounds may be formed.

In the case of forming a laminate of two or more reactive organic compounds, in the electron injection transporting layer 5, it is preferable that metals to be contained in two or more reactive organic compounds may be accordingly selected from metals having the work function between the work function of the cathode 6 and the LUMO of the light emitting layer 4 so that each value of work functions and LUMO does not be same, two or more metals may be arranged so as to have a layer constitution in which layers different from each other are laminated so that the values of work function or the like of the metals fixed in the respective layers become smaller from the cathode 6 side to the light emitting layer 4 which is an organic layer, and the metals having different work functions or the like supplement a large energy gap between the cathode 6 and the light emitting layer 4 so that the energy level becomes stepwise.

As the electron injection transporting material, there may not be particularly limited if it is a material which can stably transport the electron injected from the cathode into the light emitting layer. In the present invention, it is particularly preferable to select material which can be used for the wet film forming method. Particularly, as material forming the organic electron injection transporting layer, for example, there may be the substances which can easily form a stable radical anionic state in general such as oxadiazoles, an aluminum quinolinol complex, phenanthrolines or the like. Specifically, there may be 1,3,4-oxadiazole derivatives, 1,2,4-triazole derivatives, imidazole derivatives, BCP (bathocuproine), Bpehn (bathophenanthroline) or the like.

The electron injection transporting layer 5 of the present invention is preferably formed by the wet film forming method when the reactive organic compound is contained in the cases that solely the reactive organic compound is used to form the electron injection transporting layer 5, and the electron injection transporting layer 5 is formed by dispersing the reactive organic compound in other electron injection transporting material or adding the reactive organic compound to the electron injection transporting material. The wet film forming method similar as mentioned in the light emitting layer may be used.

As a solvent to be used to prepare a solution by solving or dispersing the reactive organic compound and/or other electron injection transporting material, there may not be particularly limited if the solvent does not solve an organic layer of lower layer. If the organic layer of lower layer is formed by an aromatic solvent, an alcohol solvent may be used for the electron injection transporting layer. If the organic layer of lower layer is formed by water or an alcohol solvent, the electron injection transporting layer may be preferably formed with the used of an aromatic solvent.

In the case that the reactive organic compound is contained in the cathode 6, it is sufficient if the electron injection transporting material is at least contained in the electron injection transporting layer 5. In this case, the electron injection transporting layer 5 may be an electron injection transporting layer formed with the use of other electron injection transporting material mentioned above.

A thickness of the electron injection transporting layer 5 may be preferably 0.1 nm to 100 nm, more preferably 0.1 nm to 50 nm, from the viewpoint of electron injection efficiency.

Particularly, if the electron injection transporting layer 5 is made of the reactive organic compound, a thickness of the electron injection transporting layer 5 may be preferably 0.1 nm to 30 nm, more preferably 0.1 nm to 10 nm.

Also, in the case that the electron injection transporting layer 5 is a layer having the reactive organic compound dispersed in other electron injection transporting material, a layer containing other electron injection transporting material having the reactive organic compound added thereto, or a laminate comprising a layer of the reactive organic compound and a layer containing other electron injection transporting material, a thickness of the reactive organic compound 5 may be preferably 0.1 nm to 300 nm, more preferably 0.1 nm to 100 nm.

(3) Positive Hole Injection Transporting Layer

The positive hole injection transporting layer 3 is a layer which can stabilize positive hole injection from the anode 2, or can stably transport the injected positive hole into the light emitting layer 4. The positive hole injection transporting layer 3 may be a positive hole injection layer which has a function of stabilizing positive hole injection from the anode 2 upon applying electric field or a positive hole transporting layer which has a function of transporting the injected positive hole from the anode 2 into the light emitting layer 4 by force of electric field. Or, the positive hole injection transporting layer 3 may have both functions of a positive hole injection layer and a positive hole transporting layer. The positive hole injection transporting layer may comprise one layer or multiple layers. The positive hole injection transporting layer 3 may be formed, for example, between the light emitting layer 4 and the anode 2 as shown in FIGS. 1 and 3.

In the present invention, in the case of embodiments of constitution of layers having the positive hole injection transporting layer 3 as shown in FIGS. 1 and 3, the positive hole injection transporting layer 3 may preferably contain at least the reactive organic compound from the viewpoint of an excellent positive hole injection function and improvement in light emitting property. However, in the present invention, in the case that the reactive organic compound is used solely at the electron injection transporting side, the positive hole injection transporting layer 3 may be formed using a positive hole injection transporting material used conventionally.

Embodiments of the positive hole injection transporting layer 3 containing the reactive organic compound are similar to those of the electron injection transporting layer 5 containing the reactive organic compound.

As the hole injecting transport material other than the reactive organic compound, it may not be particularly limited if the material is capable of stably transporting the positive hole injected from the anode into the light emitting layer. For example, other than the compounds exemplified as the light emitting material of the light emitting layer, there may be phenylamine series; starburst-type amine series; phthalocyanine series; oxides such as vanadium oxide, molybdenum oxide, ruthenium oxide, aluminum oxide or the like; amorphous carbon; derivatives of poly aniline, poly thiophene, poly phenylenevinylene or the like. Specifically, bis(N-(1-naphthyl-N-phenyl)benzidine ($\alpha$-NPD), 4,4,4-tris(3-methylphenylphenylamino)triphenylamine (MTDATA), poly-3,4-ethylenedioxythiophene-polystyrene sulfonic acid (PEDOT-PSS), polyvinylcarbazole (PVCz) or the like can be used.

As a method for forming the positive hole injection transporting layer, in the present invention, it is preferable to use the wet film farming method in order to utilize the advantage of the wet film forming method.

A thickness of the positive hole injection transporting layer 3 may be preferably 0.1 nm to 200 nm, particularly 0.1 nm to 100 nm, from the viewpoint of positive hole injection efficiency.

Particularly, if the positive hole injection transporting layer 3 is made of the reactive organic compound, a thickness of the positive hole injection transporting layer 3 may be preferably 0.1 nm to 30 nm, more preferably 0.1 nm to 10 nm.

Also, in the case that the positive hole injection transporting layer 3 is a layer having the reactive organic compound dispersed in other positive hole injection transporting material, a layer containing other positive hole injection transporting material having the reactive organic compound added thereto, or a laminate comprising a layer of the reactive organic compound and a layer containing other positive hole injection transporting material, a thickness of the positive hole injection transporting layer 3 may be preferably 0.1 nm to 300 nm, more preferably 0.1 nm to 100 nm.

2. Electrode (1) Cathode

The cathode 6 functions to inject an electron to the light emitting layer 4. The cathode 6 needs to be formed with a transparent material if light emitted from the light emitting layer 4 is taken from a cathode side. In the present invention, since the reactive organic compound is used, even though an alkali metal, an alkaline-earth metal or a rare-earth element is not used, a good electron injection effect is exhibited and the material of the cathode or the production method is not limited.

The cathode 6 may contain the reactive organic compound as aforementioned.

In the present invention, the cathode 6 may be formed by a vacuum vapor deposition method using a metal or a metal oxide generally used for forming an electrode of an organic EL element, or further a metal which is stable and has a work function of 4.2 eV or more. The cathode 6 may be suitably formed by a wet film forming method. With the use of the reactive organic compound, it is possible to obtain excellent electron injection efficiency without forming the cathode 6 using thermally reducible material by a vacuum vapor deposition method. The case of forming the cathode 6 by the wet film forming method is preferable, since a large-scale vapor deposition apparatus in comparison with the vacuum vapor deposition method is not necessary, it can be expected to simplify a production process, material can be efficiently utilized, low cost can be attained, and an area of a substrate can be increased.

An electrode material in the case of forming the electrode by the wet film forming method, it may not be particularly limited if the wet film forming method can be used. There may be a metallic particle, a metal oxide particle, a metal having a low melting point, an alloy containing a metal having a low melting point, a conductive polymer or the like.

The electrode may be formed by dispersing the metallic particle or the metal oxide particle in a solvent or in a solvent and a binder, using a gravure printing or a screen printing by the wet film forming method. The metallic particle or the metal oxide particle may not be particularly limited if it is a particle, but a metal not likely to be oxidized is preferable as being used as an electrode. Herein, the particle means a particle having a particle size of 10 μm or less, more preferably 1 μm or less. Further, a nano particle of 100 nm or less is preferable since a metal particle of smaller particle size can improve a contact area with an organic layer and a joining property with an organic layer. However, if the particle size is contrary too small, a nano particle diffuses into an organic layer so as to generate leakage current, or if the particle size of the metal particle is too large, a contact area with an organic layer is so small that a good charge injection may not be possible, thus, a preferable particle size may be about 5 nm to 1 μm.

The metallic particle or the metal oxide particle may be mixed particles of different particle size or laminated layers of different particle size. For example, a particle size of a metallic particle or a metal oxide particle at an interface of an organic layer may be small, on which a layer of a particle having larger particle size may be laminated. It is preferable to mix a particle having a different particle size since contact between particles and a contact area with an organic layer improve.

The metallic particle or the metal oxide particle preferably comprises one or more metals and contains at least a metal having a work function of 4.2 eV or more since by containing a metal having a work function of 4.2 eV or more, resistance against oxidation improves as an electrode, the electrode becomes stable, and deterioration of an element occurs less. As the metal having a work function of 4.2 eV or more, there may be Ag, Al, Au, Be, Bi, Co, Cr, Cu, Fe, Ga, Ir, Mo, Nb, Ni, Os, Pb, Pd, Pt, Sb, Sn, Ti, V, W or the like.

Also, as the metal oxide particle, there may be an ITO particle, an IZO particle, titania or the like. Further, as the metallic particle or the metal oxide particle, a particle in which an alloy particle, a metal particle or a metal oxide particle is coated with a metal may be used. Also, plural metal particles or metal oxide particles may be mixed or layers of plural metal particles or metal oxide particles may be laminated to form an electrode.

As a solvent to disperse the metallic particle or the metal oxide particle, there may not be particularly limited. A solvent which does not solve an organic layer of lower layer is preferable, for example, water, ethanol, isopropanol, benzene, toluene or a mixed solvent thereof.

Also, as a binder to disperse the metallic particle or the metal oxide particle, there may be tetramethoxysilane, tetraethoxysilane, a conductive polymer to be hereinafter described, an insulating polymer (polystyrene or PMMA) or the like.

In the case that the cathode 6 comprises a molten metal or a molten alloy containing one or more metals selected from the group consisting of bismuth, gallium, tin, lead, silver and indium, the cathode 6 can be preferably formed by a wet film forming method since each of one or more metals selected from the group consisting of bismuth, gallium, tin, lead, silver and indium and alloys thereof has a low melting point, thus, can be melted at low temperature and coated on an organic layer to form an electrode layer precisely. The melting point of the metal may not be particularly limited if it is a temperature that does not deteriorate and modify the organic layer. It is preferable to form the electrode using a material having the melting point of 150° C. or less. Also, by using the molten metals, the electrode becomes a specular surface and light emitted in an organic layer is reflected by the electrode having a specular surface, thus, light emitting efficiency improves. The melting point of the alloy can be changed or adjusted by optionally changing ratio of two or more metals. As the metal used for the alloy, specifically, there may not be particularly limited if it is a metal having a work function of 4.2 eV or more, for example, bismuth, gallium, tin, lead, silver and indium, and further an alloy of Zn, Ni or the like.

If the cathode 6 comprises a binder containing one or more metals selected from the group consisting of bismuth, gallium, tin, lead, silver and indium, it is preferable for the cathode 6 to be formed by a wet film forming method. In this case, one or more metals selected from the group consisting of bismuth, gallium, tin, lead, silver and indium are dispersed in the binder in a form of a particle or a paste. The binder may be preferably a conductive polymer to be hereinafter described.

Also, the cathode 6 may be a mixture or a laminated structure of the said metal particle and a molten metal or a molten alloy containing one or more metals selected from the group consisting of bismuth, gallium, tin, lead, silver and indium. Further, the cathode 6 may be a mixture or a laminated structure of a polymer material containing one or more metals selected from the group consisting of bismuth, gallium, tin, lead, silver and indium and the metal particle.

On the other hand, as the conductive polymer, there may be polyalkylthiophene derivatives, polyacetylene derivatives, polypyrrole derivatives, polyaniline derivatives, polythiophene derivatives, polysilane derivatives or the like. The conductive polymer may be properly solved and dispersed in a solvent to form the electrode by a wet film forming method.

A thickness of such a cathode 6 is preferably 50 nm to 50 μm depending on the material thereof. If the thickness of the cathode 6 is less than 50 nm, conductivity becomes insufficient and a function of the electrode may not be exhibited.

(2) Anode

The anode 2 needs to be formed with a transparent material if light is taken from the substrate 1 side. The anode 2 provided on the light emitting layer side of the substrate functions to inject a positive hole to the light emitting layer 4.

The anode 2 may contain the reactive organic compound as aforementioned.

The anode 2 comprising an organic EL element of the present invention may not be particularly limited if it is made of an conductive material, for example, a metal such as Au, Ta, W, Pt, Ni, Pd, Cr, Cu, Mo or the like, an oxide, an alloy or the like thereof, or a laminated structure of these metal materials. Further, a conductive inorganic oxide such as In—Sn—O, In—Zn—O, Zn—O, Zn—O—Al, Zn—Sn—O or the like, α-Si, α-SiC or the like may be used. Also, the molten metal, metallic particle and conductive polymer which are suitably used for the aforementioned cathode and can form the anode 2 by a wet film forming method may be used.

Since the anode 2 functions to supply a positive hole to an organic layer, a conductive material having a large work function may be preferably used. Particularly, it is preferable that the anode 2 is formed of at least one metal having a work function of 4.2 eV or more, an alloy thereof, or at least one kind of substance selected from the group consisting of the conductive inorganic oxides. Further, the metal to be used for the anode is easily oxidized if the work function is less than 4.5 eV, hence, the work function is preferably 4.5 eV or more.

A thickness of such an anode 2 is preferably 40 to 500 nm depending on the material thereof since if the thickness of the anode 2 is less than 40 nm, electrical resistance increases, and if the thickness of the anode 2 is over 500 nm, cutting or breaking may be caused in the layers laminated on the anode 2 (positive hole injection transporting layer 3, light emitting layer 4, electron injection transporting layer 5 and cathode 6) or short-circuit between the anode 2 and the cathode 6 may be caused due to a difference in level present at the periphery of the pattern-formed anode 2.

The anode 2 may be formed by a wet film forming method if the molten metal, the metallic particle or the conductive polymer which can be formed with the use of the wet film forming method as suitably used for the above mentioned cathode is used. In the case of using other metal or the like, the anode 2 may be formed by a dry process such as a sputtering method, a heat vacuum vapor deposition method, an EB vapor deposition, an ion plating method or the like.

As aforementioned, the electrode of an organic light emitting device of the present invention can be formed. Among them, it is preferable that at least one layer of the anode or the cathode is formed by the wet film forming method from the viewpoint of utilizing the advantage of the wet film forming method. It is more preferable that a layer of the cathode is formed by the wet film forming method from the viewpoint of a production process not requiring a vacuum apparatus.

On the other hand, both of the anode and the cathode preferably contain at least a metal having a work function of 4.2 eV or more since stability of the electrode increases, and deterioration of an element due to oxidation of the electrode or the like is less likely to occur.

Also, it is preferable that both of the anode and the cathode contain at least one or more metals selected from the group consisting of bismuth, gallium, tin, lead, silver and indium since stability of the electrode increases, deterioration of an element due to oxidation of the electrode or the like is less likely to occur, and the wet film forming method can be used to form an electrode of a side not emitting light.

3. Substrate

The substrate 1 arranged on both sides of the light emitting layer is a support medium of an organic EL element of the present invention. A material of the substrate 1 may be, for example, a flexible material or a hard material. If light emitted at the light emitting layer 4 transmits the substrate 1 side and is taken therefrom, at least the substrate 1 is required to be a transparent material. If light transmits the cathode side and is taken therefrom, at least a substrate of the cathode side (not shown) is required to be a transparent material.

As a specific material which can be used, for example, there may be glass, quartz, silicon wafer or a glass having a TFT (thin-film transistor) formed. As a polymer substrate, there may be polyethylene, polypropylene, polyethylene terephthalate, polybutylene terephthalate, polymethacrylate, polymethyl methacrylate, polymethyl acrylate, polyester, polycarbonate, polyimide, polyamideimide, polyethersulfone, polyetherimide, polyetheretherketone or the like.

Among them, quartz, glass, silicon wafer, polyimide, polyamideimide, polyethersulfone, polyetherimide, and polyetheretherketone being super engineering plastics are preferable since they have a heat resistance of 200° C. or more and a temperature of a substrate at the production process can be high considering a process of producing a TFT of an active driving display. In the case of using a polymer material, in order to prevent deterioration of an organic layer due to a gas generated from the substrate 1, a gas barrier layer formed of silicon oxide, silicon nitride or the like is desirably provided at least on the side having the anode 2 formed of the substrate 1.

A thickness of such a substrate 1 can be set considering status of use or the like of a material or an organic light emitting device, for example, there may be about 0.005 to 5 mm.

FIGS. 1 to 3 show the cases of having the positive hole injection transporting layer and the electron injection transporting layer other than the light emitting layer as examples of the organic EL element of the present invention, but there may be any constitutions of layers other than the above. Other functional layer or the like, for example, a carrier block layer, which is a layer for increasing re-coupling efficiently by preventing an positive hole or an electron from penetrating, and further preventing an exciter from diffusing to keep the exciter in the light emitting layer, may be provided to the organic EL element of the present invention. Specifically for example, a positive hole block layer or an exciter diffusing layer may be provided between the electron injection transporting layer and the light emitting layer. Materials used for these optional layers may not be particularly limited, and a material generally used for forming each layer may be used.

As aforementioned, among the organic light emitting devices of the present invention, the organic light emitting device of an embodiment having one light emitting unit containing at least one light emitting layer is specifically explained, however, as the organic light emitting device of the present invention, there may be a serially laminated type organic light emitting device having two or more light emitting units laminated in series so that the organic layer has two or more light emitting layers, which simultaneously emit light. In the case of such a serially laminated type organic light emitting device, burden imposed on the process is high if all layers are formed by a vacuum vapor deposition method, therefore, according to the present invention, efficiency of process increasingly improves by virtue of changing at least a part of a process of forming a layer to the wet film forming method. Hence, as a suitable embodiment of the present invention, there may be a serially laminated type organic EL element.

That is, other embodiment of the organic light emitting device of the present invention is an organic light emitting device, wherein the organic light emitting device has multiple light emitting units containing at least one light emitting layer between an anode and a cathode facing each other, the light emitting units being individually separated by a charge generating layer, and the charge generating layer and/or an organic layer containing a charge injection transporting material disposed adjacent to the charge generating layer contains a reactive organic compound and/or a reaction product thereof.

If the charge generating layer and/or the organic layer containing a charge injection transporting material disposed adjacent to the charge generating layer contain the reactive organic compound, similarly as above, positive hole and electron injection barriers from the charge generating layer to each unit lower so as to improve an element characteristic.

There is a relationship that a luminance of the organic light emitting device improves according to an electric current density and a life span of an element shortens according to the electric current density, hence, if a conventional single layer element having one light emitting unit and the organic EL element of the present embodiment comprising the serially laminated type organic light emitting device having multiple light emitting units are compared, the serially laminated type organic light emitting device having multiple light emitting layers can obtain a required luminance with a low electric current density by 1/n of that of the conventional single layer element. Since necessary current density to obtain a required certain luminance is 1/n, a life span of element of the serially laminated type organic light emitting device becomes longer than that of the conventional single layer element. However, since "n" elements are disposed in series, driving voltage becomes "n" times. Further, in the serially laminated type organic light emitting device having multiple light emitting layers, light emitting units having different properties and light emitting colors may be laminated. The serially laminated type organic light emitting device can attain a device having a high luminance and a long life span, thus can be applied for the use of a back light of a personal computer or a lighting apparatus.

The serially laminated type organic EL element may be preferably formed with the use of a production method of the present invention comprising a step of forming a layer containing a reactive organic compound as the charge generating layer and/or an organic layer disposed adjacent to the charge generating layer.

Hereinafter, among the organic light emitting devices of the present invention, the serially laminated type organic EL element will be explained.

Figure 4:
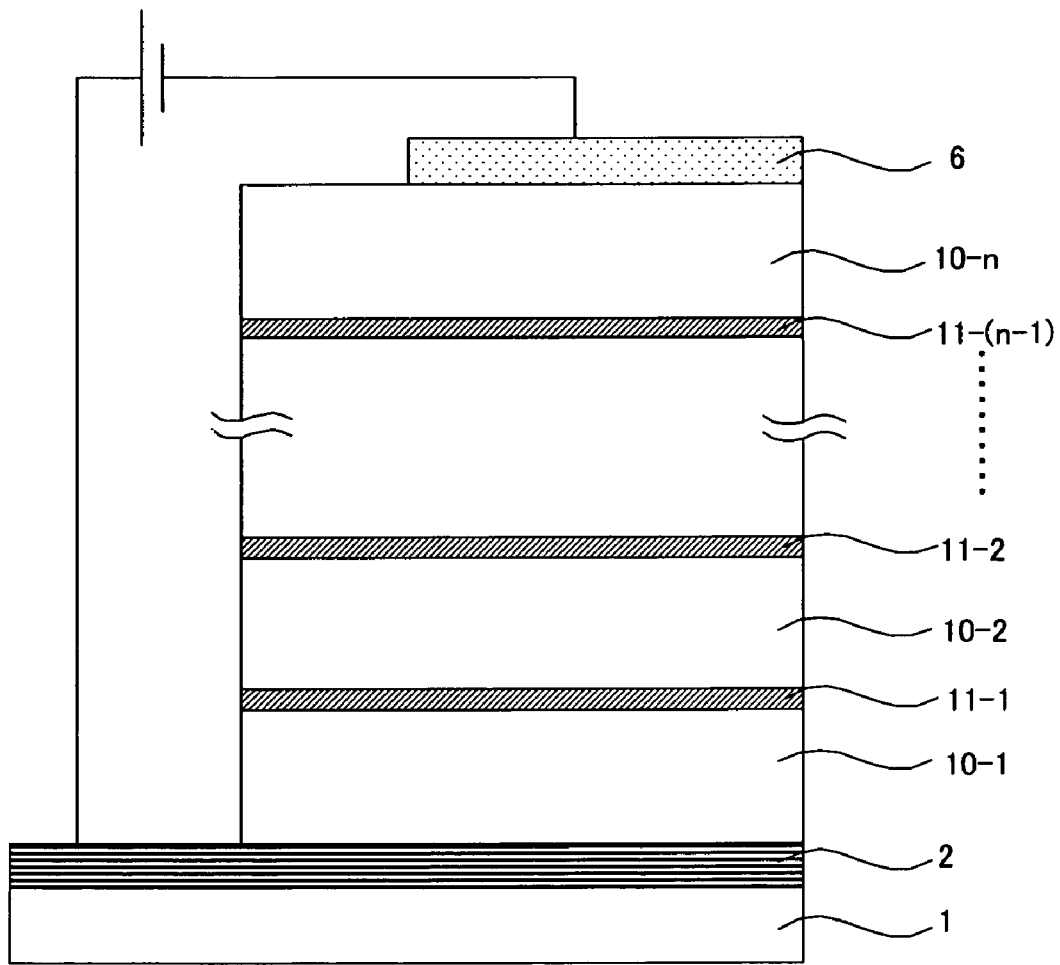
FIG. 4 is a cross-sectional view showing another example of an organic EL element of the present invention.

FIG. 4 is a schematic cross-sectional view of the serially laminated type organic EL element, which is one embodiment of the organic light emitting device of the present invention. On a substrate 1, an anode 2, a light emitting unit 10-1, a charge generating layer 11-1, a light emitting unit 10-2, a charge generating layer 11-2, . . . , a charge generating layer 11-($n-1$), a light emitting unit 10-$n$ so as to repeat, and finally a cathode 6 are laminated in this order.

In the present invention, the light emitting unit means a constituent of the organic EL element except for an anode and a cathode. Therefore, in the serially laminated type organic EL element of the present invention, each light emitting unit may be similarly formed by using similar material as the organic EL element having one light emitting unit. It is preferable to use a material capable of forming the light emitting unit by the wet film forming method as much as possible and to form the light emitting unit by the wet film forming method from the viewpoint of utilizing the advantage of the wet film forming method.

The charge generating layer 11 in the present invention means a layer which functions to inject a positive hole to the direction of the cathode of the element and inject an electron to the direction of the anode upon applying voltage. It is preferable to form the charge generating layer by the wet film forming method from the viewpoint of utilizing the advantage of the wet film forming method.

The charge generating layer 11 may not be particularly limited if it functions as above. The charge generating layer 11 in the present invention may have an embodiment of containing the reactive organic compound and an embodiment of not containing the reactive organic compound.

If the charge generating layer contains the reactive organic compound, the charge generating layer can be formed with the reactive organic compound alone. In this case, similarly as the electron injection transporting layer, the charge generating layer may be a laminate of two or more reactive organic compounds or a mixed layer of two or more reactive organic compounds. Also, the reactive organic compound may be mixed by being dispersed, added or the like in the following material for forming the charge generating layer to form the charge generating layer.

As the material for forming the charge generating layer, there may not be particularly limited. For example, there may be a conductive material such as one or more metal particles and/or metal oxide particles as exemplified for the cathode, or an electrical isolating material having a specific resistance of $1.0\times10^2$ Ω·cm or more, preferably $1.0\times10^5$ Ω·cm or more. The electrical isolating material having a specific resistance of $1.0\times10^2$ Ω·cm or more, preferably $1.0\times10^5$ Ω·cm or more, is preferable in preventing cross talk with an electrode. As the electrical isolating material having a specific resistance of $1.0\times10^2$ Ω·cm or more, preferably $1.0\times10^5$ Ω·cm or more, for example, there may be a laminate or a mixed layer of an arylamine compound and a metal oxide or a metal halide capable of forming a charge transfer complex by an oxidation-reduction reaction disclosed in JP-A No. 2003-272860.

It is preferable that the charge generating layer 11 of the present invention has a laminate of a layer comprising one or more metal particles and/or metal oxide particles and a layer containing the reactive organic compound, or has a mixed layer containing one or more metal particles and/or metal oxide particles and the reactive organic compound from the viewpoint of protecting the light emitting unit beneath the charge generating layer upon forming the light emitting unit provided on the charge generating layer.

Also, in the present invention, if the charge generating layer 11 does not contain the reactive organic compound, the charge generating layer 11 may be formed with the use of a material for forming the charge generating layer alone, and the reactive organic compound is preferably contained in the organic layer containing the charge injection transporting material disposed adjacent to the charge generating layer. The organic layer disposed adjacent to the charge generating layer is typically the electron injection transporting layer, the light emitting layer, the positive hole injection transporting layer or the like of the light emitting unit, hence, in this case, it is sufficient if the reactive organic compound is contained in any layer as explained for the organic EL element having one unit. If there is a case of the serially laminated type organic EL element in which the charge generating layer and/or the organic layer disposed adjacent to the charge generating layer does not contain the reactive organic compound, the case corresponds to the organic light emitting device of the present invention if, for example, the electrode contains the reactive organic compound.

As aforementioned, a material of the cathode of the organic light emitting device of the present invention may not be limited by using the reactive organic compound since it is not necessary to vapor deposit a thermally reducible electrode material on the electron injection transporting layer or the light emitting layer like an organic salt and/or an organometallic complex used as a conventional electron injection material.

Hence, the cathode of the organic light emitting device of the present invention can be a transparent electrode in the constitution having the lower electrode on the substrate as an anode and the upper electrode as a cathode.

In the organic light emitting device of the present invention, in the case of starting the production of the organic EL element with the formation of the cathode on the substrate, an excellent electron injection transporting function can be attained. Therefore, the organic light emitting device of the present invention can be suitably applied as an organic light emitting device having the cathode as the lower electrode on the substrate and the anode as the upper electrode. Herein, the lower electrode means an electrode formed first and the upper electrode means an electrode formed last. For example, in FIG. 1, the lower electrode is the anode 2 and the upper electrode is the cathode 6, and in FIG. 3, the lower electrode is the cathode 6 and the lower electrode is the anode 2.

Also, the organic light emitting device of the present invention can be suitably applied as an element in which at least one of the anode and the cathode is a transparent electrode, and which has a top emission (top surface light emission) structure emitting light from an upper part.

Further, the organic light emitting device of the present invention can be suitably applied as a bifacial light emitting element in which both anode and cathode are transparent electrodes.

In the organic light emitting device of the present invention, by using the reactive organic compound, a layer having the electron injection transporting function can be formed by the wet film forming method. Further, since a material for the cathode and the production method of the cathode may not be limited, the cathode can also be formed by the wet film forming method. Hence, all light emitting units and an upper electrode among the anode and the cathode may be produced in the air. Such a case is preferable since a large-scale vapor deposition apparatus is not necessary at all, a production process can be simplified, material can be used efficiently, low cost can be attained, and an area of the substrate can be increased.

II. Organic Transistor

Next, an organic transistor, which is other example of the organic electronic device of the present invention, will be explained.

FIGS. 5 to 8 are schematic cross-sectional views showing examples of the organic transistor of the present invention.

Figure 5:
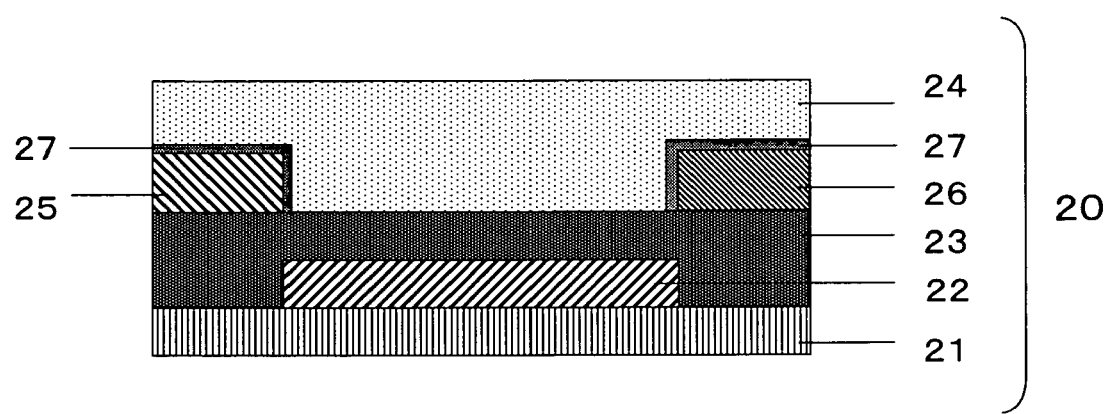
FIG. 5 is a cross-sectional view showing an example of an organic transistor of the present invention.
Figure 7:
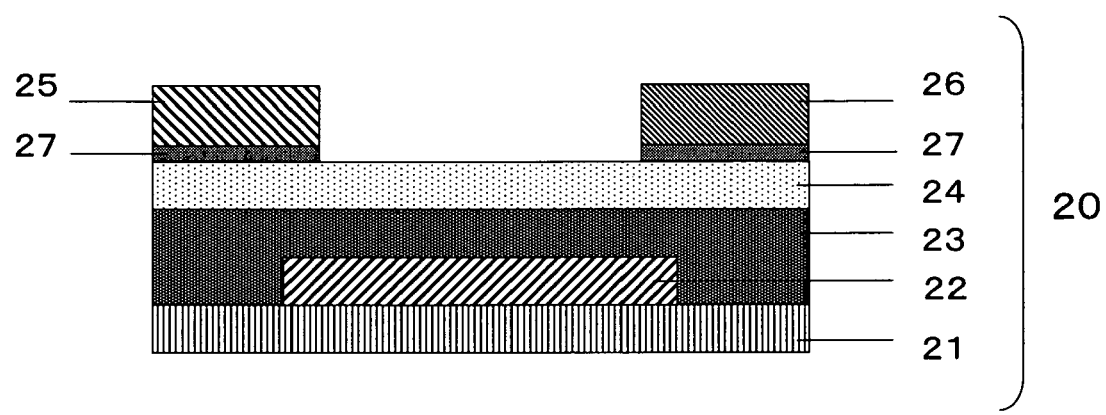
FIG. 7 is a cross-sectional view showing another example of an organic transistor of the present invention.

As a first embodiment of the organic transistor 20 of the present invention, as shown in FIGS. 5 and 7, there may be an organic transistor wherein, on a substrate 21, a gate electrode 22, a source electrode 25 and a drain electrode 26 facing each other are formed, an organic semiconductor layer 24 and an insulating layer 23 are disposed between the gate electrode 22 and the source electrode 25 and the gate electrode 22 and the drain electrode 26, and charge injection layers 27 are framed between the source electrode 25 and the organic semiconductor layer 24, and between the drain electrode 26 and the organic semiconductor layer 24 respectively.

Figure 6:
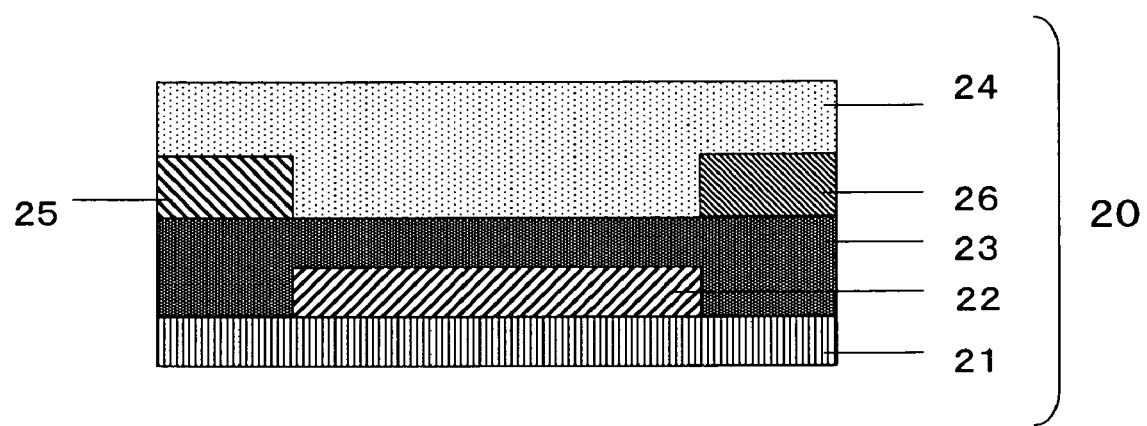
FIG. 6 is a cross-sectional view showing another example of an organic transistor of the present invention.
Figure 8:
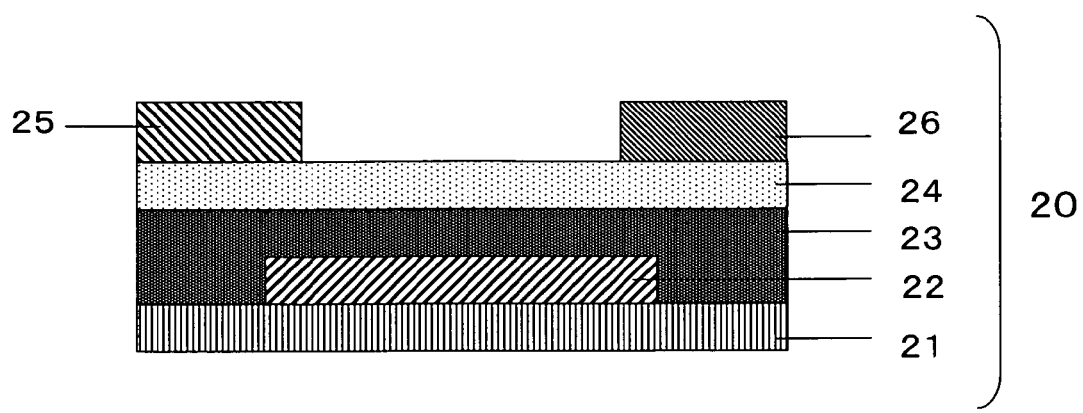
FIG. 8 is a cross-sectional view showing another example of an organic transistor of the present invention.

As a second embodiment of the organic transistor 20 of the present invention, as shown in FIGS. 6 and 8, there may be an organic transistor wherein, on a substrate 21, a gate electrode 22, a source electrode 25 and a drain electrode 26 facing each other are formed, and an organic semiconductor layer 24 and an insulating layer 23 are disposed between the gate electrode 22 and the source electrode 25 and between the gate electrode 22 and the drain electrode 26.

In the organic transistor of the present invention, in the case of the first embodiment having a layer containing a reactive organic compound and/or a reaction product thereof between at least one electrode and a organic layer containing a charge injection transporting material, typically, in the case of a constitution of layers as shown in FIGS. 5 and 7, at least one of the charge injection layers 27 contains the reactive organic compound, as the result, the reaction product may be contained in at least one of the charge injection layers 27 or at an interface of at least one of charge injection layers 27 and the organic semiconductor layer 24, or further at an interface of at least one of the charge injection layers 27 and the electrode.

In the organic transistor of the present invention, in the case of the second embodiment wherein at least one electrode and/or an organic layer containing a charge injection transporting material disposed adjacent to the electrode contains a reactive organic compound and/or a reaction product thereof, firstly, in the case of a constitution of layers as shown in FIGS. 5 to 8, the source electrode 25 and/or the drain electrode 26 contains the reactive organic compound, as the result, the reactive organic compound or the reaction product thereof may be contained at an interface of the electrode and the charge injection layer 27 or the organic semiconductor layer 24, in the charge injection layer 27 or the organic semiconductor layer 24 disposed adjacent to the electrode.

Further, as the second embodiment, in the case of a constitution of layers as shown in FIGS. 6 and 8, the organic semiconductor layer 24 contains the reactive organic compound, as the result, the reaction product may be contained at an interface of the organic semiconductor layer 24 and the electrode.

Also, as the second embodiment, in the case of a constitution of layers as shown in FIGS. 5 and 7, the charge injection layer 27 is formed by containing the reactive organic compound in the charge injection transporting material, as the result, the reaction product is contained at an interface of the electrode and the charge injection layer 27 or at an interface of the charge injection layer 27 and the organic semiconductor layer 24. This case also corresponds to the first embodiment.

The organic transistor of the present invention can use, by containing the reactive organic compound, an organic semiconductor material being less likely to be oxidized and having a large HOMO value (for example, about 6 eV) for driving an element without any problems by virtue of lowering of a charge injection barrier between the source electrode 25 and the organic semiconductor layer 24 and between the drain electrode 26 and the organic semiconductor layer 24. Also, by virtue of lowering of a charge injection barrier between the organic semiconductor layer and the source electrode or the drain electrode, an element characteristic stabilizes since an on-current value of the organic transistor improves and the organic semiconductor layer is less likely to be oxidized.

1. Charge Injection Layer

It is necessary to select material for forming the charge injection layer 27 so as to function as a positive hole injection layer in the case that the organic semiconductor layer 24 is a p-type semiconductor, and so as to function as an electron injection layer in the case that the organic semiconductor layer 24 is a n-type semiconductor. In the case that the charge injection layer 27 functions as a positive hole injection layer, the layer may be preferably formed similarly to the positive hole injection transporting layer of the organic EL element. In the case that the charge injection layer 27 functions as an electron injection layer, the layer may be preferably formed similarly to the electron injection transporting layer of the organic EL element.

2. Organic Semiconductor Layer

It is preferable that a carrier mobility of the organic semiconductor layer being an organic layer is $10^{-6}$ cm/Vs or more, particularly for the organic transistor, $10^{-3}$ cm/Vs or more is preferable from the viewpoint of transistor property.

As a material for forming the organic semiconductor layer, an organic semiconductor material of low molecular weight compound or polymer having a donating property or an accepting property can be used.

As the organic semiconductor material having a donating property, there may be acene molecule material, metallic phthalocyanine, thiophene oligomer, regioregula poly(3-alkyl thiophene) or the like. As the organic semiconductor material having an accepting property, there may be fullerene, hexadecafluorocopper phthalocyanine or the like. Further, the organic semiconductor material disclosed by JP-A No. 2004-6754 may be suitably used.

Also, the organic semiconductor layer can be formed by a wet coating or a dry process.

3. Substrate, Electrode and Insulating Layer

As for the substrate, the gate electrode, the source electrode, the drain electrode and the insulating layer, materials may not be particularly limited, for example, the following materials can be used to form.

(1) Substrate

The substrate 21 is a support medium of the organic electronic device of the present invention, which may be, for example, a flexible material or a hard material. Specifically, a similar material as that of the substrate of the organic EL element can be used.

(2) Electrode

As the gate electrode, the source electrode and the drain electrode, a material may not be particularly limited if it is a conductive material. Specifically, a similar metal or metal oxide as that of the electrode of the organic EL element can be used, particularly, platinum, gold, silver, copper, aluminum, indium, ITO and carbon are preferable.

(3) Insulating layer

For the insulating layer which insulates the gate electrode, various kinds of insulating materials can be used. Also, either an inorganic oxide or an organic compounds can be used, particularly, an inorganic oxide having high relative permittivity is preferable. As the inorganic oxide, there may be silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth niobate tantalate, yttrium trioxide or the like. Among them, silicon oxide, aluminum oxide, tantalum oxide and titanium oxide are preferable. Also, an inorganic nitride such as silicon nitride, aluminum nitride or the like can be suitably used.

As the organic compound used for the insulating layer, there may be polyimide, polyamide, polyester, polyarylate, a photoradical polymerizable or photocationic polymerizable photocurable resin, or a copolymer containing acrylonitrile component, polyvinylphenol, polyvinylalcohol, a novolak resin, cyanoethylpullulan, a phosphazene compound containing a polymer or an elastomer, or the like.

In FIGS. 5 to 8, as examples of the organic transistor of the present invention, an organic transistor having a positive hole injection layer and an electron injection layer in addition to the insulating layer and the organic semiconductor layer is exemplified, however, there may be any constitution of layers. In the organic transistor of the present invention, for example, other functional layers including a layer for preventing surface contamination of the gate electrode upon forming the drain electrode and the source electrode on the gate insulating layer such as an interlayer insulation film may be further provided. Materials used for the optional layers may not be particularly limited, and materials generally used for forming each layer may be used.

III. Organic Solar Battery

Figure 9:
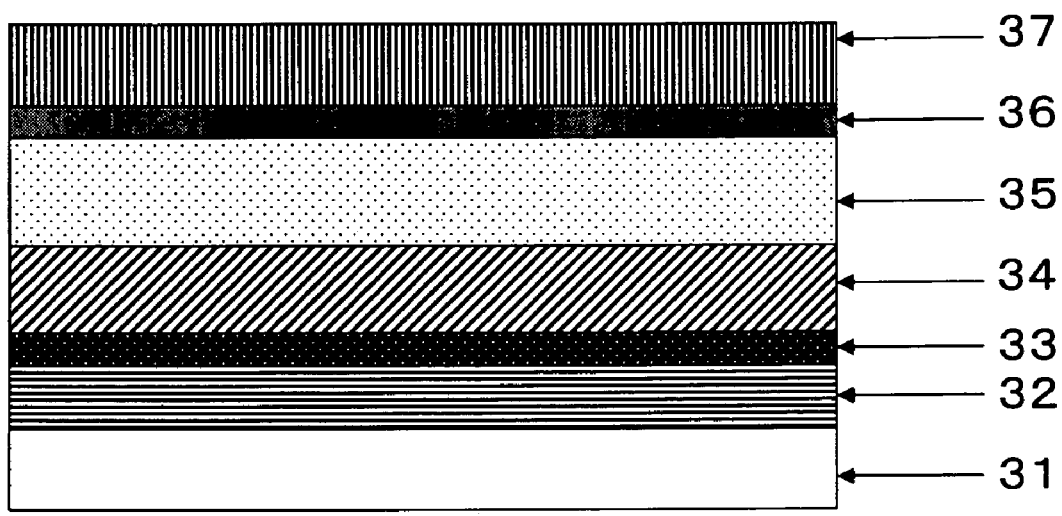
FIG. 9 is a cross-sectional view showing an example of an organic solar battery of the present invention.
Figure 10:
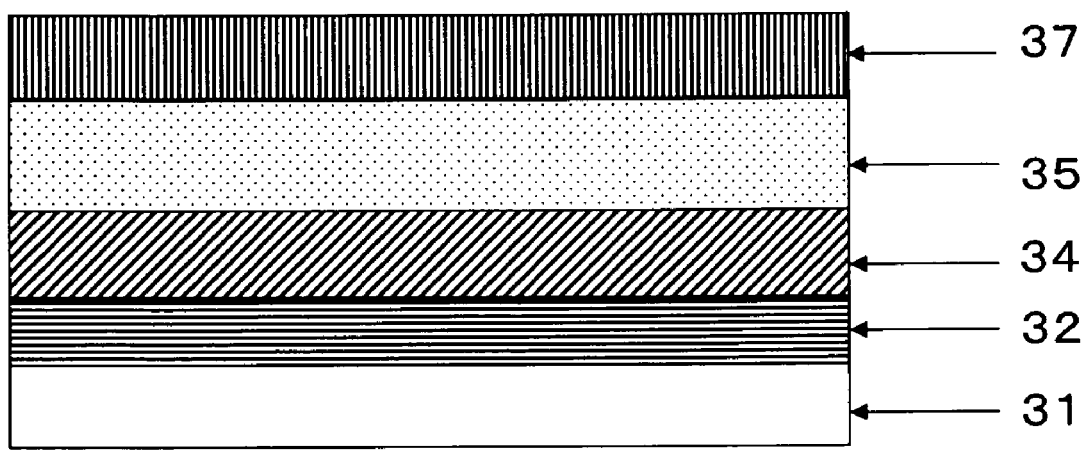
FIG. 10 is a cross-sectional view showing another example of an organic solar battery of the present invention.

FIGS. 9 and 10 are schematic cross-sectional views showing examples of an organic solar battery of the present invention.

An embodiment of the organic solar battery of the present invention, as shown in FIG. 9, has a positive hole injection layer 33, a positive hole transporting layer 34, an electron transporting layer 35 and an electron injection layer 36 being organic layers provided in this order between a first electrode 32 formed on a substrate 31 and a second electrode 37.

Other embodiment of the organic solar battery of the present invention, as shown in FIG. 10, has a positive hole transporting layer 34 and an electron transporting layer 35 being organic layers provided in this order between a first electrode 32 formed on a substrate 31 and a second electrode 37.

In the organic solar battery of the present invention, in the case of the first embodiment having a layer containing a reactive organic compound and/or a reaction product thereof between at least one electrode and an organic layer containing a charge injection transporting material, in the case of a constitution of layers as shown in FIG. 9, typically, a positive hole injection layer 33 and/or an electron injection layer 36 contains the reactive organic compound, as the result, the reaction product is contained in the positive hole injection layer 33 and/or the electron injection layer 36, at an interface of the positive hole injection layer 33 and/or the electron the injection layer 36 and a positive hole transporting layer 34 and/or the electron transporting layer 35, and further at an interface of at least one of the positive hole injection layer 33 and/or the electron injection layer and the electrode.

In the organic transistor of the present invention, in the case of the second embodiment wherein at least one electrode and/or an organic layer containing a charge injection transporting material disposed adjacent to the electrode contains a reactive organic compound and/or a reaction product thereof, firstly, in the case of a constitution of layers as shown in FIGS. 9 and 10, the first electrode 32 and/or the second electrode 37 contains the reactive organic compound, as the result, the reactive organic compound or the reaction product thereof is contained at an interface of the electrode and the positive hole injection layer 33 and/or the electron injection layer 36 or the positive hole transporting layer 34 and/or the electron transporting layer 35, in the positive hole injection layer 33 and/or the electron injection layer 36 or the positive hole transporting layer 34 and/or the electron transporting layer 35 disposed adjacent to the electrode.

Further, as the second embodiment, in the case of a constitution of layers as shown in FIG. 10, the positive hole transporting layer 34 and/or the electron transporting layer 35 contains the reactive organic compound, as the result, the reaction product is contained at an interface of the positive hole transporting layer 34 and/or the electron transporting layer 35 and the electrode.

Also, as the second embodiment, in the case of a constitution of layers as shown in FIG. 9, the positive hole injection layer 33 and/or the electron injection layer 36 is formed by containing the reactive organic compound in the charge injection transporting material, as the result, the reaction product is contained at an interface of the electrode and positive hole injection layer 33 and/or the electron injection layer 36 or at an interface of the positive hole injection layer 33 and/or the electron injection layer 36 and the positive hole transporting layer 34 and/or the electron transporting layer 35. This case also corresponds to the first embodiment.

In the organic solar battery of the present invention, by containing the reactive organic compound, a charge injection barrier between the electrode and the organic layer lowers. As the result, the organic solar battery of the present invention becomes to be able to efficiently produce internal charge so that electromotive force can be obtained efficiently.

As for the substrate 31, the first electrode 32, the second electrode 37, the positive hole transporting layer 34 and the electron transporting layer 35 being organic layers, materials may not be particularly limited, for example, the following materials can be used to form.

1. Substrate

The substrate 31 is a support medium of the organic electronic device of the present invention, which may be, for example, a flexible material or a hard material. Specifically, a similar material as that of the substrate of the organic EL element can be used.

2. Electrode

As the first electrode 32, a material may not be particularly limited if it is a conductive material. Specifically, a similar conductive material as that of the anode of the organic EL element can be used. It is preferable to accordingly select the material considering direction of light radiation, a work function of material forming the second electrode or the like. In the case of the substrate being a light receiving surface, the first electrode is preferably a transparent electrode. In this case, a material generally used for a transparent electrode can be used. Specifically, there may be In—Zn—O (IZO), In—Sn—O (ITO), ZnO—Al, Zn—Sn—O or the like.

As the second electrode 37, a material may not be particularly limited if it is a conductive material. Specifically, a similar conductive material as that of the cathode of the organic EL element can be used. In the case of the substrate being a light receiving surface, the first electrode may be a transparent electrode and, in this case, the second electrode layer does not need to be transparent. If an electrode having a high work function is used for the first electrode, conventionally, a material having a low work function has been used for the second electrode. However, in the present invention, since charge injection efficiency is high, an electrode can be formed using a metal having a high work function. The second electrode may be a single layer or may be a laminate using materials of different work functions.

3. Positive Hole Transporting Layer and Electron Transporting Layer

As a material for forming the positive hole transporting layer 34, there may not be particularly limited if it functions as an electron donor. Specifically, there may be polyphenylene and derivatives thereof, polyphenylene vinylene and derivatives thereof, polysilane and derivatives thereof, polyalkylthiophene and derivatives thereof, porphyrin derivatives, phthalocyanine derivatives, an organometallic polymer or the like.

On the other hand, as a material for forming the electron transporting layer 35, there may not be particularly limited if it functions as an electron acceptor. Specifically, there may be CN-poly(phenylene-vinylene), MEH—CN-poly(phenylene-vinylene), a polymer containing a —CN group or a —CF$_3$ group, a —CF$_3$ substituted polymer thereof, poly(fluorene) derivatives, fullerene derivatives such as C$_{60}$, carbon nanotube, perylene derivatives, polycyclic quinone, quinacridone or the like.

4. Positive Hole Injection Layer and Electron Injection Layer

As the charge injection transporting material in the case that the positive hole injection layer 33 and/or the electron injection layer 36 is formed by containing the reactive organic compound in the charge injection transporting material, in the case of forming the positive hole injection layer 33, a material for forming the positive hole transporting layer 34 may be used, and in the case of forming the electron injection layer 36, a material for forming the electron transporting layer 35 may be used.

In FIGS. 9 and 10, the case having the positive hole injection layer and the electron injection layer in addition to the positive hole transporting layer and the electron transporting layer as examples of the organic solar battery of the present invention, however, the organic solar battery may have any constitutions of layers. In the case of the above examples, the positive hole transporting layer and the electron transporting layer work as a photoelectric converting layer having a function of contributing to charge separation in the organic solar battery and transporting the generated electron and positive hole to the electrode in the opposite direction respectively. As the photoelectric converting layer, there may be a case of having at least one of the positive hole transporting layer which functions as an electron donor or the electron transporting layer which functions as an electron acceptor, a case of having the electron positive hole transporting layer which functions as both electron donor and electron acceptor, or the like.

<Method for Producing an Organic Electronic Device>

Next, a method for producing an organic electronic device of the present invention will be explained.

A first embodiment of a method for producing an organic electronic device of the present invention comprising a substrate, two or more electrodes facing each other disposed on the substrate and at least one organic layer disposed between two electrodes among the electrodes, comprises a step of forming a layer containing a reactive organic compound between at least one electrode and an organic layer containing a charge injection transporting material.

As a second embodiment of a method for producing an organic electronic device of the present invention comprising a substrate, two or more electrodes facing each other disposed on the substrate and at least one organic layer disposed between two electrodes among the electrodes, comprises a step of forming a layer containing a reactive organic compound as at least one electrode and/or an organic layer containing a charge injection transporting material disposed adjacent to the electrode.

The method for producing an organic electronic device of the present invention can improve a charge injection function by a step of forming a layer containing a reactive organic compound between at least one electrode and an organic layer containing a charge injection transporting material, or a step of forming a layer containing a reactive organic compound as at least one electrode and/or an organic layer containing a charge injection transporting material disposed adjacent to the electrode. That is, in the method for producing an organic electronic device of the present invention, an organic electronic device capable of injecting a charge efficiently can be produced since a charge injection transporting material being formerly neutral can react with the reactive organic compound to increase charge density. Since charge transfer can be easily performed between a neutral charge injection transporting material and the reactive organic compound, a material or method for forming the charge injection layer or the electrode layer disposed adjacent to the charge injection layer may not be limited unlike a conventional case, and an organic electronic device having a good charge injection function can be produced without using a vapor deposition method.

Hence, in the method for producing an organic electronic device of the present invention, the layer having the reactive organic compound can be formed by a wet film forming method, thus it is preferable. In the case of using the wet film forming method, a large-scale vapor deposition apparatus is not necessary at all, a production process can be simplified, a material can be efficiently utilized, a low cost can be attained, and an area of the substrate can be increased.

As the wet film forming method, there may be a coating method such as a spin coating method, a casting method, a dipping method, a bar coating method, a blade coating method, a roll coating method, a gravure coating method, a flexographic printing method, a spray coating method or the like and a patterning method such as a printing, an ink jet method or the like, using a melt, a solution or a mixture of material. Among them, it is preferable to use the spin coating method and the ink jet method from the viewpoint of a production process.

In the method for producing an organic electronic device of the present invention, further, it is preferable to comprise a step that the reactive organic compound and the charge injection transporting material form a reaction product.

The step that the reactive organic compound and the charge injection transporting material form the reaction product may have a heating process after forming the layer containing the reactive organic compound. It is preferable to have the heating process from the viewpoint of promoting the formation of the reaction product. In this case, after forming the layer containing the reactive organic compound may be immediately after forming the layer containing the reactive organic compound or not immediately after forming the layer containing the reactive organic compound. As an example of a heating process which does not need to be performed immediately after forming the layer containing the reactive organic compound, for example, there may be a case that at least after a step of forming a light emitting layer containing reactive organic compound, there is further a step of forming a cathode, and after these steps, there is a heating process.

The heating process may be preferably performed at 80 to 250° C., more preferably at 80 to 100° C., from the viewpoint of removing a solvent, stability of film property by heating at glass transition temperature or more (but at decomposition temperature or less). As means of heating, for example, an infrared ray heater, a hot plate, a clean oven, a vacuum oven or the like may be used.

The organic electronic device of the first embodiment may be preferably produced using the method for producing the organic electronic device of the first embodiment of the present invention, particularly, using the method for producing the organic electronic device of the first embodiment further comprising a step that the reactive organic compound and the charge injection transporting material form the reaction product.

The organic electronic device of the second embodiment may be preferably produced using the method for producing the organic electronic device of the second embodiment of the present invention, particularly, using the method for producing the organic electronic device of the second embodiment further comprising a step that the reactive organic compound and the charge injection transporting material form the reaction product.

As other process in the method for producing an organic electronic device of the present invention, there may not be particularly limited.

The present invention may not be limited to the above embodiments. The embodiments are examples and any embodiments having substantially similar structures as the technical idea described in claims of the present invention and have similar operation and effect are incorporated in the technical scope of the present invention.

EXAMPLES

Next, the following examples further describe and demonstrate embodiments of the present invention. The examples are given solely for the purpose of illustration and are not to be construed as limitations of the present invention.

Example 1

Formation of Anode

A transparent glass substrate (non-alkali glass NA35; manufactured by NH Techno Glass Corporation) having a length to width dimension of 40 mm×40 mm and a thickness of 0.7 mm was prepared as a substrate. After washing the transparent glass substrate in accordance with the predetermined method, a thin film (thickness of 130 nm) of indium-zinc-oxide compound (IZO) was formed by a sputtering method. In forming the IZO thin film, a mixed gas of Ar and $O_2$ (volume ratio of $Ar:O_2=100:1$) was used as a sputtering gas, pressure was set as 0.1 Pa, and DC output was set as 150 W.

Next, a photosensitive resist (OFPR-800; manufactured by TOKYO OHKA KOGYO CO., LTD.) was applied on the anode followed by mask exposure, development (using NMD3 (developing solution); manufactured by TOKYO OHKA KOGYO CO., LTD.) and etching, thereby, the anode was formed in a pattern.

(Formation of Positive Hole Injection Transporting Layer)

Next, after washing the transparent glass substrate comprising the anode and the insulating layer followed by UV-ozonation, poly(ethylenedioxythiophene) poly(styrene-sulfonate) (PEDOT-PSS) represented by the following formula (1) was applied on the transparent glass substrate by a spin coating method so as to cover the anode followed by drying, thus being formed a positive hole injection transporting layer (thickness of 80 nm):
Formula (1)

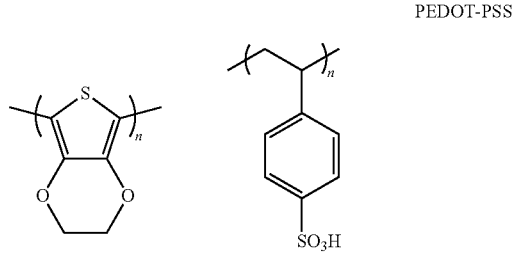

PEDOT-PSS wherein, "n" is 10,000 to 500,000.

(Formation of Light Emitting Layer)

A polymer (5BTF8) comprising poly(9,9dioctylfluorene-co-benzothiazol) (F8BT) and poly(9,9dioctylfluorene) (PF8) represented by the following formula (2) was synthesized in a glove box which was in the state of low oxygen (oxygen concentration of 1 ppm or less) and low moisture (water vapor concentration of 1 ppm or less), applied on the positive hole injection transporting layer by a spin coating method followed by drying, thus being formed a light emitting layer (thickness of 80 nm), wherein the polymer (5BTF8) was a light emitting material having F8BT and PF8 blended by a weight ratio of 5:95:
Formula (2)

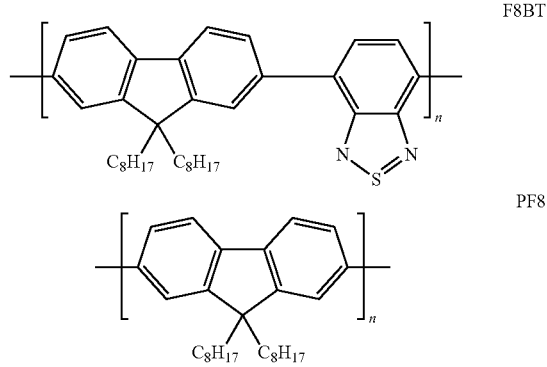

wherein, "n" is 100,000 to 1,000,000.

(Electron Injection Transporting Layer)

Further, a layer comprising lithium diisopropylamide having a thickness of 3 nm was formed on the light emitting layer by a spin coating method, thus being formed an electron injection transporting layer.

(Formation of Cathode)

On the electron injection transporting layer, Au was vapor deposited to have a thickness of 150 nm as a cathode. The vapor deposition conditions were a degree of vacuum of $5\times10^{-5}$ Pa and a depositing speed of 2 to 3 Å/sec.

Then, sealing was performed with a non-alkali glass in a glove box which was in the state of low oxygen (oxygen concentration of 1 ppm or less) and low moisture (water vapor concentration of 1 ppm or less).

Thereby, an organic EL element comprising the anode patterned in a line form of 2 mm width, the electron injection transporting layer and the cathode formed in a line form of 2 mm width so as to be perpendicular to the anode, and having four light emission areas (area of 4 mm$^2$) was produced.

(Result)

A current density upon impressing a voltage of 6 V on the organic EL element was about 110 mA/cm$^2$. A luminance observed from the anode side was about 12,000 cd/m$^2$. The results clearly show that a good element characteristic can be obtained even by forming the electron injection transporting layer comprising lithium diisopropylamide by coating and using a metal having a large work function as the cathode.

Comparative Example 1

An organic EL element was produced similarly as Example 1 except without forming the electron injection transporting layer. A current density upon impressing a voltage of 13 V on the organic EL element was about 50 mA/cm$^2$. A luminance observed from the anode side was about 3 cd/m$^2$. The results clearly show that a current-voltage property declines when there is no electron injection transporting layer comprising lithium diisopropylamide since an electron injection barrier from the cathode to the light emitting layer is large.

Example 2

The process same as in Example 1 was carried out as far as the electron injection transporting layer was formed. Then, a cathode was formed using a metal comprising gallium:indium:tin (weight ratio of 50:25:25). That is, the alloy was melted by a heat treatment and coated to form the cathode in a predetermined pattern.

A current density upon impressing a voltage of 6 V on the organic EL element was about 100 mA/cm$^2$. A luminance observed from the anode side was about 10,000 cd/m$^2$. The results clearly show that a good element characteristic can be obtained even by forming the electron injection transporting layer comprising lithium diisopropylamide by coating, and then, forming the cathode by coating.

Example 3

An organic EL element was produced similarly as Example 1 except that an electron injection transporting layer comprising lithium tetramethylcyclopentadiene was formed. A current density upon impressing a voltage of 6 V on the organic EL element was about 50 mA/cm$^2$. A luminance observed from the anode side was about 5,000 cd/m$^2$. The results clearly show that a good element characteristic can be obtained even by forming the electron injection transporting layer comprising lithium tetramethylcyclopentadiene by coating and using a metal having a large work function as the cathode.

Example 4

An organic EL element was produced similarly as Example 1 except that a layer was formed by a mixture of polyvinyl alcohol, which is a polymer compound, and lithium diisopropylamide (weight ratio of 1:1) as an electron injection transporting layer. A current density upon impressing a voltage of 6 V on the organic EL element was about 70 mA/cm$^2$. A luminance observed from the anode side was about 7,000 cd/m$^2$. The results clearly show that a good element characteristic can be obtained even by forming the electron injection transporting layer containing lithium diisopropylamide by coating and using a metal having a large work function as the cathode.

Example 5

The process same as in Example 1 was carried out as far as the electron injection transporting layer comprising lithium diisopropylamide was formed. Then, an Ag paste (trade mark: DOTITE for an inorganic EL; available from Fujikura Kasei Co., Ltd.) was applied to have a thickness of 3 μm by a screen printing to form an organic EL element.

A current density upon impressing a voltage of 6 V on the organic EL element was about 10 mA/cm$^2$. A luminance observed from the anode side was about 100 cd/m$^2$. The results clearly show that a good element characteristic can be obtained even by forming the electron injection transporting layer comprising lithium diisopropylamide by coating and using a metal having a large work function as the cathode.

Comparative Example 2

An organic EL element was produced similarly as Example 5 except forming a cathode on a light emitting layer by an Ag paste without forming the electron injection transporting layer comprising lithium diisopropylamide. A current density upon impressing a voltage of 20 V on the organic EL element was about 10 mA/cm$^2$. A luminance observed from the anode side was about 20 cd/m$^2$. The results clearly show that a current-voltage property declines when there is no electron injection transporting layer comprising lithium diisopropylamide since an electron injection barrier from the cathode to the light emitting layer is large.

Comparative Example 3

An organic EL element was produced similarly as Example 1 except forming an electron injection layer using lithium ethoxide ($CH_3CH_2OLi$). A current density upon impressing a voltage of 6 V on the organic EL element was about 13 mA/cm$^2$. A luminance observed from the anode side was about 85 cd/m$^2$. The results clearly show that a current-voltage property declines when the electron injection layer is formed of an injection material having oxygen directly bonded to an alkali metal since an electron injection barrier from the cathode to the light emitting layer is large.

Example 6

Formation of Positive Hole Injection Transporting Layer

Using an ITO glass substrate having an ITO (indium-tin oxide; manufactured by Asahi Glass Co., Ltd.) which has a sheet resistance of 15 Ω/square formed as a transparent anode, a positive hole injection transporting layer (thickness of 80 nm) was formed by applying poly(ethylenedioxythiophene) poly(styrenesulfonate) (PEDOT-PSS) on the anode followed by drying.

(Formation of Light Emitting Layer)

A polymer (5BTF8) comprising poly(9,9dioctylfluorene-co-benzothiazol) (F8BT) and poly(9,9dioctylfluorene) (PF8) was synthesized and applied on the positive hole injection transporting layer followed by drying, thus being formed a light emitting layer (thickness of 80 nm). The polymer (5BTF8) was a light emitting material having F8BT and PF8 blended by a weight ratio of 5:95.

(Formation of Electron Injection Transporting Layer; Layer Containing Reactive Organic Compound)

Further, an electron injection transporting layer comprising the reactive organic compound of the present invention was formed by applying pentamethylcyclopentadienyl lithium on the light emitting layer to have a thickness of 3 nm.

(Formation of Cathode)

On the electron injection transporting layer, Ag was vapor deposited to have a thickness of 100 nm as a cathode. The vapor deposition conditions were a degree of vacuum of $5\times10^{-5}$ Pa and a depositing speed of 2 to 3 Å/sec.

Then, sealing was performed with a glass in a glove box which was in the state of low oxygen (oxygen concentration of 1 ppm or less) and low moisture (water vapor concentration of 1 ppm or less).

Thereby, an organic EL element comprising the anode patterned in a line form of 2 mm width and the cathode formed in a line form of 2 mm width so as to be perpendicular to the anode, and having four light emission areas (area of 4 mm$^2$) was produced.

A current density upon impressing a voltage of 6 V on the organic EL element was about 100 mA/cm$^2$. A luminance observed from the anode side was about 10,000 cd/m$^2$. The results clearly show that a good electron injection property can be obtained when the electron injection transporting layer comprising the reactive organic compound is formed, even if a metal having a large work function and being not thermally reducible is used as the cathode.

Example 7

An organic EL element was produced similarly as Example 6 except that an electron injection transporting layer comprising a reactive organic compound of the present invention was formed by applying tris(butylcyclopentadienyl)yttrium to have a thickness of 3 nm.

A current density upon impressing a voltage of 6 V on the organic EL element was about 100 mA/cm$^2$. A luminance observed from the anode side was about 9,000 cd/m$^2$. The results clearly show that a good electron injection property can be obtained when the electron injection transporting layer comprising the reactive organic compound is formed, even if a metal having a large work function and being not thermally reducible is used as the cathode.

Example 8

An organic EL element was produced similarly as Example 6 except that an electron injection transporting layer comprising a reactive organic compound of the present invention was formed by applying bis(cyclopentadienyl)magnesium to have a thickness of 3 nm.

A current density upon impressing a voltage of 6 V on the organic EL element was about 80 mA/cm$^2$. A luminance observed from the anode side was about 7,000 cd/m$^2$. The results clearly show that a good electron injection property can be obtained when the electron injection transporting layer comprising the reactive organic compound is formed, even if a metal having a large work function and being not thermally reducible is used as the cathode.

Example 9

An organic EL element was produced similarly as Example 6 except that an electron injection transporting layer comprising a reactive organic compound of the present invention was formed by applying bis(cyclopentadienyl)strontium to have a thickness of 3 nm.

A current density upon impressing a voltage of 6 V on the organic EL element was about 90 mA/cm$^2$. A luminance observed from the anode side was about 9,000 cd/m$^2$. The results clearly show that a good electron injection property can be obtained when the electron injection transporting layer comprising the reactive organic compound is formed, even if a metal having a large work function and being not thermally reducible is used as the cathode.

Example 10

An organic EL element was produced similarly as Example 6 except that an electron injection transporting layer comprising a reactive organic compound of the present invention was formed by applying tris(tetramethylcyclopentadienyl)europium to have a thickness of 3 nm.

A current density upon impressing a voltage of 6 V on the organic EL element was about 100 mA/cm$^2$. A luminance observed from the anode side was about 9,000 cd/m$^2$. The results clearly show that a good electron injection property can be obtained when the electron injection transporting layer comprising the reactive organic compound is formed, even if a metal having a large work function and being not thermally reducible is used as the cathode.

Example 11

An organic EL element was produced similarly as Example 6 except that an electron injection transporting layer comprising a reactive organic compound of the present invention was formed by applying tris(tetramethylcyclopentadienyl) cobalt to have a thickness of 3 nm.

A current density upon impressing a voltage of 6 V on the organic EL element was about 80 mA/cm$^2$. A luminance observed from the anode side was about 7,000 cd/m$^2$. The results clearly show that a good electron injection property can be obtained when the electron injection transporting layer comprising the reactive organic compound is formed, even if a metal having a large work function and being not thermally reducible is used as the cathode.

Comparative Example 4

An organic EL element was produced similarly as Example 6 without forming the electron injection transporting layer comprising the reactive organic compound. A current density upon impressing a voltage of 10 V on the organic EL element was about 50 mA/cm$^2$. A luminance observed from the anode side was about 1,000 cd/m$^2$. The results clearly show that a current-voltage property declines when there is no electron injection transporting layer comprising the reactive organic compound since an electron injection barrier from the cathode to the light emitting layer is large.

Example 12

The process same as in Example 6 was carried out as far as the electron injection transporting layer was formed. Then, a cathode was formed using a metal comprising gallium:indium:tin (weight ratio of 50:25:25). That is, the alloy was melted by a heat treatment and coated to form the cathode in a predetermined pattern.

A current density upon impressing a voltage of 6 V on the organic EL element was about 70 mA/cm$^2$. A luminance observed from the anode side was about 5,000 cd/m$^2$. The results clearly show that a good element characteristic can be obtained even by forming the electron injection transporting layer comprising the reactive organic compound by a wet film forming method, and then, forming the cathode by a wet film forming method.

Example 13

The process same as in Example 6 was carried out as far as the light emitting layer was formed. A cathode was formed by coating an Ag paste having tris(butylcyclopentadienyl)yttrium dispersed therein to be a weight ratio (Ag:reactive organic compound) of 97:3 on the light emitting layer.

A current density upon impressing a voltage of 6 V on the organic EL element was about 50 mA/cm$^2$. A luminance observed from the anode side was about 4,000 cd/m$^2$. The results clearly show that a good element characteristic can be obtained even by forming the cathode containing the reactive organic compound by a wet film forming method.

Example 14

The process same as in Example 6 was carried out as far as the light emitting layer was formed. Then, a charge generating layer containing a reactive organic compound was formed by coating an ITO particle paste having tris(butylcyclopentadienyl)yttrium dispersed therein on the light emitting layer. Then again, a positive hole injection transporting layer (PEDOT-PSS) of 80 nm and a light emitting layer (5BTF8) of 80 nm were formed.

Tris(butylcyclopentadienyl)yttrium of 3 nm was formed as an electron injection transporting layer, thereafter, an cathode having a pattern was formed by coating an alloy comprising gallium:indium:tin (weight ratio of 50:25:25).

A current density upon impressing a voltage of 15 V on the organic EL element was about 80 mA/cm$^2$. A luminance observed from the anode side was about 16,000 cd/m$^2$. The results clearly show that a good charge injection property can be obtained in the organic EL element having multiple light emitting units.

What is claimed is:

1. An organic electronic device comprising a substrate, two or more electrodes facing each other disposed on the substrate and at least one organic layer disposed between two electrodes among the electrodes, wherein a layer containing a reactive organic compound having a reducing portion or a proton accepting portion and/or a reaction product thereof is disposed between at least one electrode and an organic layer containing a charge injection transporting material and the reducing portion or the proton accepting portion of the reactive organic compound directly reacts with the charge injection transporting material to form a radical anion of the charge injection transporting material;

wherein the reactive organic compound is such that oxygen is not directly bonded to a metal, and is at least one kind of compound selected from the group consisting of a metallic cyclopentadiene compound;

wherein the metal contained in the metallic cyclopentadiene compound is at least one kind of metal selected from the group consisting of an alkali metal, an alkaline-earth metal scandium and yttrium; and wherein the at least one electrode adjacent to the layer containing the reactive organic compound and/or the reaction product thereof is comprised of (i) a vacuum deposited film comprising a metal which has a work function of 4.2 eV or more (except a metal which can reduce a metal ion contained in the metallic compound to a metal under vacuum condition), or (ii) a film formed by a wet film forming method comprising one or more materials selected from the group consisting of a metallic particle, a metal oxide particle, a metal having a low melting point and an alloy containing a metal having a low melting point.

2. An organic electronic device according to claim 1, wherein the charge injection transporting material is an electron injection transporting material.

3. An organic electronic device according to claim 1, wherein a charge of the reducing portion or the proton accepting portion of the reactive organic compound is neutral.

4. An organic electronic device according to claim 1, wherein an electron affinity of the reducing portion or the proton accepting portion of the reactive organic compound is smaller than an electron affinity of the charge injection transporting material.

5. An organic electronic device according to claim 1, wherein a part of the reactive compound forms a charge transfer complex as the reaction product by a direct reaction of the reducing portion or the proton accepting portion of the reactive organic compound with the charge injection transporting material.

6. An organic electronic device according to claim 1, wherein a part of the reactive organic compound and a charge injection transporting material from a charge transfer complex as the reaction product by a direct reaction of the reducing portion or the proton accepting portion of the reactive organic compound with the charge injection transporting material.

7. An organic electronic device according to claim 1, wherein the reducing portion or the proton accepting portion of the reactive organic compound contains at least one kind of compound selected from the group consisting of a boron compound, a silicon compound, a nitrogen compound, a phosphorus compound, a sulfur compound, a selenium compound, a tellurium compound, a cyclic hydrocarbon compound, a nitrogen-containing cyclic compound, a sulfur-containing cyclic compound, a selenium-containing cyclic compound, a tellurium-containing cyclic compound and a condensed polycyclic compound thereof.

8. An organic light emitting device having a structure of the organic electronic device defined by claim 1, wherein the organic electronic device contains a light emitting material.

9. An organic light emitting device according to claim 8, wherein the organic light emitting device has multiple light emitting units containing at least one light emitting layer between an anode and a cathode facing each other, the light emitting units being individually separated by a charge generating layer, and the charge generating layer and/or the organic layer containing a charge injection transporting material disposed adjacent to the charge generating layer contains the reactive organic compound and/or the reaction product thereof.

10. A method for producing an organic electronic device comprising a substrate, two or more electrodes facing each other disposed on the substrate and at least one organic layer disposed between two electrodes, among the electrodes, comprising the steps of:
  forming a layer containing a reactive organic compound having a reducing portion or a proton accepting, portion between at least one electrode and an organic layer containing a charge injection transporting material;
  producing a radical anion of the charge injection transporting material by a direct reaction of the reducing portion or the proton accepting portion of the reactive organic compound with the charge injection transporting material; and
  forming the at least one electrode by (i) a vacuum vapor deposition method using a metal which has a work function of 4.2 eV or more (except a metal which can reduce a metal ion contained in the metallic compound to a metal under vacuum condition), or (ii) a wet film forming method using one or more materials selected from the group consisting of a metallic particle, a metal oxide particle, a metal having a low melting point, an alloy containing a metal having a low melting point and a conductive polymer,
  wherein the reactive organic compound is such that oxygen is not directly bonded to a metal, and is at least one kind of compound selected from the group consisting of a metallic cyclopentadiene compound;
  wherein the metal contained in the metallic cyclopentadiene compound is at least one kind of metal selected from the group consisting of an alkali metal, an alkaline-earth metal, scandium and yttrium.

11. A method for producing an organic electronic device according to claim 10, wherein the layer containing a reactive organic compound is formed by a wet film forming method.

12. A method for producing an organic electronic device according to claim 10, wherein a part of the reactive organic compound and the charge injection transporting material form the charge transfer complex as a reaction product by a direct reaction of the reducing portion or the proton accepting portion of the reactive organic compound with the charge injection transporting material.

13. A method for producing an organic electronic device according to claim 10, wherein the organic electronic device to be produced is an organic light emitting device having multiple light emitting units containing at least one light emitting layer between an anode and a cathode facing each other, the light emitting units being individually separated by a charge generating layer, and the method comprises a step of forming the layer containing a reactive organic compound as the charge generating layer and/or the organic layer adjacent to the charge generating layer.

14. An organic electronic device comprising a substrate, two or more electrodes facing each other disposed on the substrate and at least one organic layer disposed between two electrodes among the electrodes, wherein at least one electrode and/or an organic layer containing a charge injection transporting material disposed adjacent to the at least one electrode contains a reactive organic compound having a reducing portion or a proton accepting portion and/or a reaction product thereof and the reducing portion or the proton accepting portion of the reactive organic compound directly reacts with the charge injection transporting material to form a radical anion of the charge injection transporting material;
  wherein the reactive organic compound is such that oxygen is not directly bonded to a metal, and is at least one kind of compound selected from the group consisting of a metallic cyclopentadiene compound;
  wherein the metal contained in the metallic cyclopentadiene compound is at least one kind of metal selected from the group consisting of an alkali metal, an alkaline-earth metal, scandium and yttrium; and
  wherein the at least one electrode adjacent to the layer containing the reactive organic compound and/or the reaction product thereof is comprised of (i) a vacuum deposited film comprising a metal which has a work function of 4.2 eV or more (except a metal which can reduce a metal ion contained in the metallic compound to a metal under vacuum condition), or (ii) a film formed by a wet film forming method comprising one or more materials selected from the group consisting of a metallic particle, a metal oxide particle, a metal having a low melting point and an alloy containing a metal having a low melting point.

15. A method for producing an organic electronic device comprising a substrate, two or more electrodes facing each other disposed on the substrate and at least one organic layer disposed between two electrodes among the electrodes, comprising the steps of:

forming a layer containing a reactive organic compound having a reducing portion or a proton accepting portion as at least one electrode and/or an organic layer containing a charge injection transporting material disposed adjacent to the at least one electrode;

producing a radical anion of the charge injection transporting material by a direct reaction of the reducing portion or the proton accepting portion of the reactive organic compound with the charge injection transporting material; and forming the at least one electrode by (i) a vacuum vapor deposition method using a metal which has a work function of 4.2 eV or more (except a metal which can reduce a metal ion contained in the metallic compound to a metal under vacuum condition), or (ii) a wet film forming method using one or more materials selected from the group consisting of a metallic particle, a metal oxide particle, a metal having a low melting point, an alloy containing a metal having a low melting point and a conductive polymer, wherein the reactive organic compound is such that oxygen is not directly bonded to a metal, and is at least one kind of compound selected from the group consisting of a metallic cyclopentadiene compound;

wherein the metal contained in the metallic cyclopentadiene compound is at least one kind of metal selected from the group consisting of an alkali metal, an alkaline-earth metal, scandium and yttrium.

* * * * *